(12) United States Patent
Saitoh et al.

(10) Patent No.: US 6,885,599 B2
(45) Date of Patent: Apr. 26, 2005

(54) SEMICONDUCTOR WAFER, SEMICONDUCTOR CHIP, AND MANUFACTURING METHOD OF SEMICONDUCTOR DEVICE

(75) Inventors: Yoshikazu Saitoh, Hamura (JP); Sadayuki Morita, Higashiyamato (JP); Takahiro Sonoda, Fussa (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/764,539

(22) Filed: Jan. 27, 2004

(65) Prior Publication Data

US 2004/0184344 A1 Sep. 23, 2004

Related U.S. Application Data

(63) Continuation of application No. 09/906,060, filed on Jul. 17, 2001, now Pat. No. 6,711,075.

(30) Foreign Application Priority Data

Jul. 19, 2000 (JP) ...................................... 2000-218234

(51) Int. Cl.[7] ................................................ G11C 7/00
(52) U.S. Cl. .......................... 365/201; 365/63; 324/765
(58) Field of Search ...................... 365/201, 63, 185.09; 324/756, 757, 758, 765, 538

(56) References Cited

U.S. PATENT DOCUMENTS

| | | | |
|---|---|---|---|
| 3,867,693 A | 2/1975 | Saxenmeyer, Sr. | 324/153 |
| 4,342,957 A | 8/1982 | Russell | 324/73 |
| 4,563,636 A | 1/1986 | Snook et al. | 324/66 |
| 5,294,776 A | 3/1994 | Furuyama | 365/201 |
| 5,298,433 A * | 3/1994 | Furuyama | 438/6 |
| 5,377,152 A | 12/1994 | Kushiyama et al. | 365/206 |
| 5,953,271 A | 9/1999 | Ooishi | 365/201 |
| 6,087,841 A | 7/2000 | Bonaccio et al. | 324/757 |
| 6,279,141 B1 * | 8/2001 | Hsuan et al. | 716/1 |
| 6,441,606 B1 * | 8/2002 | Caldwell et al. | 324/158.1 |
| 6,696,849 B2 * | 2/2004 | Ban et al. | 324/760 |
| 6,711,075 B2 * | 3/2004 | Saitoh et al. | 365/201 |

* cited by examiner

Primary Examiner—Tan T. Nguyen
(74) Attorney, Agent, or Firm—Antonelli, Terry, Stout & Kraus, LLP

(57) ABSTRACT

By using a small number of needles and contact terminals at burn-in, electric contact check is performed between each needle and each terminal provided in each semiconductor chip, and thereby the yield of assembled products can be improved. A packaging structure in which, for example, a volatile memory chip and a nonvolatile memory chip are formed is assembled in accordance with a production scheme in which burn-in of each memory chip is performed while still under the state of a semiconductor wafer, and by forming the packaged structure using the good volatile memory chip subjected to burn-in and likewise, also, the nonvolatile memory chip. At this burn-in, contact check is performed by bringing a needle, provided in a burn-in board, into contact with, for example, six test-only signal terminals of a test circuit formed on each semiconductor chip.

6 Claims, 20 Drawing Sheets

Fig. 3

| Test Clock | CTRL1 | CTRL2 | Test I/O | Command register | Status |
|---|---|---|---|---|---|
| X | 0 | 0 | X | Reset to 000 | Reset of test circuit, Deactivation of test circuit |
| L→H | 0 | 1 | X | Set of input command | Operational start of test circuit |
| L→H | 1 | 0 | Command input | Input of TEST I/O | Reception of test command |
| L→H | 1 | 1 | X | No change | NOP |

Fig. 4

| Test mode | Test command | | | Status of test circuit | Function of Test I/O at test mode |
|---|---|---|---|---|---|
| | 1st·Cyc | 2nd·Cyc | 3rd·Cyc | | |
| Current mode | 0 | 0 | 0 | Deactivation of test circuit | Memory data terminal |
| | 0 | 0 | 1 | Burn-in (Write) operation | Borrow output of address counter |
| | 0 | 1 | 0 | Burn-in (Read) operation | Borrow output of address counter |
| | 0 | 1 | 1 | Monitor burn-in operation | 0: PASS  1: Fail output |
| Concurrent mode | 1 | 0 | 0 | Establishment of multi-choice mode flag | In conformity to current mode |
| | 1 | 0 | 1 | Establishment of redundant bit mode flag | |
| | 1 | 1 | 0 | Outside regulation | |
| | 1 | 1 | 1 | Outside regulation | |

*Fig. 19*

| A0 | A1 | A2 | Mode | M0 | M1 | M2 | M3 | M4 | M5 | M6 | M7 |
|---|---|---|---|---|---|---|---|---|---|---|---|
| 0 | 0 | 0 | 1 | 1 | 0 | 0 | 0 | 0 | 0 | 0 | 0 |
| 1 | 0 | 0 | 1 | 0 | 1 | 0 | 0 | 0 | 0 | 0 | 0 |
| 0 | 1 | 0 | 1 | 0 | 0 | 1 | 0 | 0 | 0 | 0 | 0 |
| 1 | 1 | 0 | 1 | 0 | 0 | 0 | 1 | 0 | 0 | 0 | 0 |
| 0 | 0 | 1 | 1 | 0 | 0 | 0 | 0 | 1 | 0 | 0 | 0 |
| 1 | 0 | 1 | 1 | 0 | 0 | 0 | 0 | 0 | 1 | 0 | 0 |
| 0 | 1 | 1 | 1 | 0 | 0 | 0 | 0 | 0 | 0 | 1 | 0 |
| 1 | 1 | 1 | 1 | 0 | 0 | 0 | 0 | 0 | 0 | 0 | 1 |
| 0 | 0 | 0 | 0 | 1 | 1 | 0 | 0 | 0 | 0 | 0 | 0 |
| 1 | 0 | 0 | 0 | 1 | 1 | 0 | 0 | 0 | 0 | 0 | 0 |
| 0 | 1 | 0 | 0 | 0 | 0 | 1 | 1 | 0 | 0 | 0 | 0 |
| 1 | 1 | 0 | 0 | 0 | 0 | 1 | 1 | 0 | 0 | 0 | 0 |
| 0 | 0 | 1 | 0 | 0 | 0 | 0 | 0 | 1 | 1 | 0 | 0 |
| 1 | 0 | 1 | 0 | 0 | 0 | 0 | 0 | 1 | 1 | 0 | 0 |
| 0 | 1 | 1 | 0 | 0 | 0 | 0 | 0 | 0 | 0 | 1 | 1 |
| 1 | 1 | 1 | 0 | 0 | 0 | 0 | 0 | 0 | 0 | 1 | 1 |

Mode=1: Normal decode operation (Always selecting one line)
Mode=0: Multi-choice decode operation (Always selecting two lines)

SEMICONDUCTOR WAFER, SEMICONDUCTOR CHIP, AND MANUFACTURING METHOD OF SEMICONDUCTOR DEVICE

This application is a continuation of U.S. application Ser. No. 09/906,060, filed Jul. 17, 2001, now U.S. Pat. No. 6,711,075, the entire disclosure of which is incorporated herein by reference.

TECHNICAL FIELD OF THE INVENTION

The present invention relates to a burn-in technique of a semiconductor device. The present invention also relates to, for example, in a semiconductor device like a MCP (Multi Chip Package) having two semiconductor chips thereof formed as a SRAM, a flash memory and the like, a technique effectively applied to a test system suitable for a contact check method used between each needle and each terminal of the semiconductor chips at burn-in performed under the state of a semiconductor wafer.

BACKGROUND OF THE INVENTION

As a technique that the present inventors have studied, a burn-in technique of the semiconductor device is considered as follows. That is, for example, the burn-in technique of a MCP forming a SRAM and a flash memory has the steps of forming respective semiconductor chips of the SRAM and the flash memory to a substrate, connecting electrically the semiconductor chips and the substrate by a wire bonding or the like, molding the semiconductor chips and the substrate with a resin to assemble a packaging structure, and then testing the packaging structure, wherein a temperature and an electrical stress which exceed a rating are applied to perform the burn-in technique. Because this burn-in performs a screening to eliminate some MCPs that may become bad (i.e., defective) in the future, only good MCPs are shipped as products.

SUMMARY OF THE INVENTION

Now, as a result of consideration of the above-mentioned burn-in technique by inventors of the present invention, certain findings became apparent. For example, in a method of performing the burn-in after assembly of the MCPs, as described above, yield of each semiconductor chip of the SRAM and the flash memory largely affects that of the assembled MCPs, so that there is status not being capable of expectedly improving the yield of the MCPs. That is, in case of adopting this method, if either semiconductor chip of the SRAM or the flash memory becomes bad, MCPs assembled by using these bad semiconductor chips also become bad in quality and it seems thereby that the yield of the assembled products decreases.

Therefore, the present inventors have had an idea of a method of performing the burn-in at a stage of a semiconductor wafer, and assembling the MCPs after bad semiconductor chips are redundantly relieved or are eliminated, in order to improve the yield of each semiconductor chip of the SRAM and the flash memory. At this time, it is necessary to perform electric contact check between each of the needles connected to a test apparatus and each of the terminals of the semiconductor chips. Therefore, for example, similarly to the assembled product, a method can be used in which a voltage is applied between each of the needles and each of the terminals to be electrically conducted to the needles, and an electric connection/non-connection is judged by detecting electric current flowing therebetween.

However, it is difficult to make this current-detecting method of applying the voltage corresponding to a multi-pin scheme depending on the number of terminals in accordance with high performance and large capacity of the recent semiconductor devices. That is, as the number of terminals of the semiconductor chips increases, needles, ammeters and the like corresponding to this number of terminals are required and, hence, these increasing numbers become enormous. Therefore, it is difficult to use practically the current-detecting method.

An object of the present invention is to provide a test system of a semiconductor device, wherein, while a method of performing the burn-in at a stage of semiconductor wafer is applied, improvement of the yield of assembling products can be achieved by using a small number of needles and a small number of contact terminals at the burn-in, performing an electric contact check between each needle and each terminal of semiconductor chips, and utilizing good semiconductor chips subjected to the burn-in.

The above-mentioned and other objects and novel characteristics of the present invention will be apparent from description of the present specification and the accompanying drawings.

Regarding the disclosure in this application, a summary of representative inventive aspects thereof will now be described.

That is, a first semiconductor wafer according to the present invention is applied to a semiconductor wafer including a plurality of semiconductor chip areas, each of which has a memory matrix, each of the semiconductor chips having a first terminal which inputs a signal for judging electric connection/non-connection between a needle connected to a test apparatus at burn-in and a terminal provided in each of the semiconductor chips, and a second terminal which outputs a response signal for responding to this input signal.

A second semiconductor wafer according to the present invention is one that each of the semiconductor chips has a plurality of address input terminals for specifying an address of a memory matrix, and a plurality of data input/output terminals for inputting and outputting write data and read data, and a plurality of control signal terminals for controlling write and read operations, and a plurality of test-only signal terminals for judging electric connection/non-connection between a needle connected to a test apparatus at burn-in and a terminal provided in each of the semiconductor chips.

Also a semiconductor chip according to the present invention comprises a memory circuit having a volatile memory matrix, and a test circuit inputting a signal for judging electric connection/non-connection between a needle connected to a test apparatus at burn-in and a terminal of the semiconductor chip and outputting a response signal for responding to this input signal, and judging electric connection/non-connection between a needle connected to the test apparatus at the burn-in and a terminal of the semiconductor chip.

Moreover, the test circuit of the semiconductor chip comprises a test clock terminal for inputting a test clock signal, a first and second test control terminals for inputting a test control signal, a test input/output terminal for inputting and outputting test input/output data, a power terminal supplied with a power supply voltage, and an earth terminal supplied with an earth voltage.

And, said test circuit synchronizes the test control signal being input from the test clock terminal to be controlled in accordance with a combination of the test control signals being input from the first and second test control terminals, and has a shift register for shifting test command data being input from the test input/output terminal and a decoder for decoding data for this shift register, such that operation of a test mode is initiated in accordance with a current status flag and a concurrent status flag being output from the decoder.

Moreover, said test circuit has a counter for counting synchronously the test clock signal being input from the test clock terminal, and uses a count value of the counter as an address signal of the memory circuit at the test mode, and outputs a carry signal of the counter from the test input/output terminal to thereby judge electric connection/non-connection between each needle and each terminal of the semiconductor chip in the test apparatus.

Additionally, said carry signal of the counter is used as write data of the memory circuit. Alternatively, the carry signal of the counter and the read data of the memory circuit are operated by exclusive OR, and output from the test input/output terminal, and are used as a monitor of bad rate during the burn-in.

Also, a manufacturing method of semiconductor devices according to the present invention is applied to the manufacture of semiconductor devices in which semiconductor chips are cut from a semiconductor wafer and a first semiconductor chip and a second semiconductor chip, separated from each other, are formed, the method comprising a step of performing burn-in of the first and second semiconductor chips before the semiconductor chips are cut out from the semiconductor wafer.

Moreover, said step of performing burn-in includes a step of performing a contact check for judging electric connection/non-connection between each needle connected to a test apparatus and each terminal provided in each of the first and second semiconductor chips of the semiconductor wafer.

BRIEF DESCRIPTION OF THE DRAWINGS

FIG. 3 is an explanatory view showing a truth value table of a test circuit according to one embodiment of the present invention.

FIG. 4 is an explanatory view showing a test command table according to one embodiment of the present invention.

FIG. 19 is an explanatory view showing a truth value table of a multiple-choice decoder according to one embodiment of the present invention.

DESCRIPTION OF THE PREFERRED EMBODIMENTS

Figure 1:
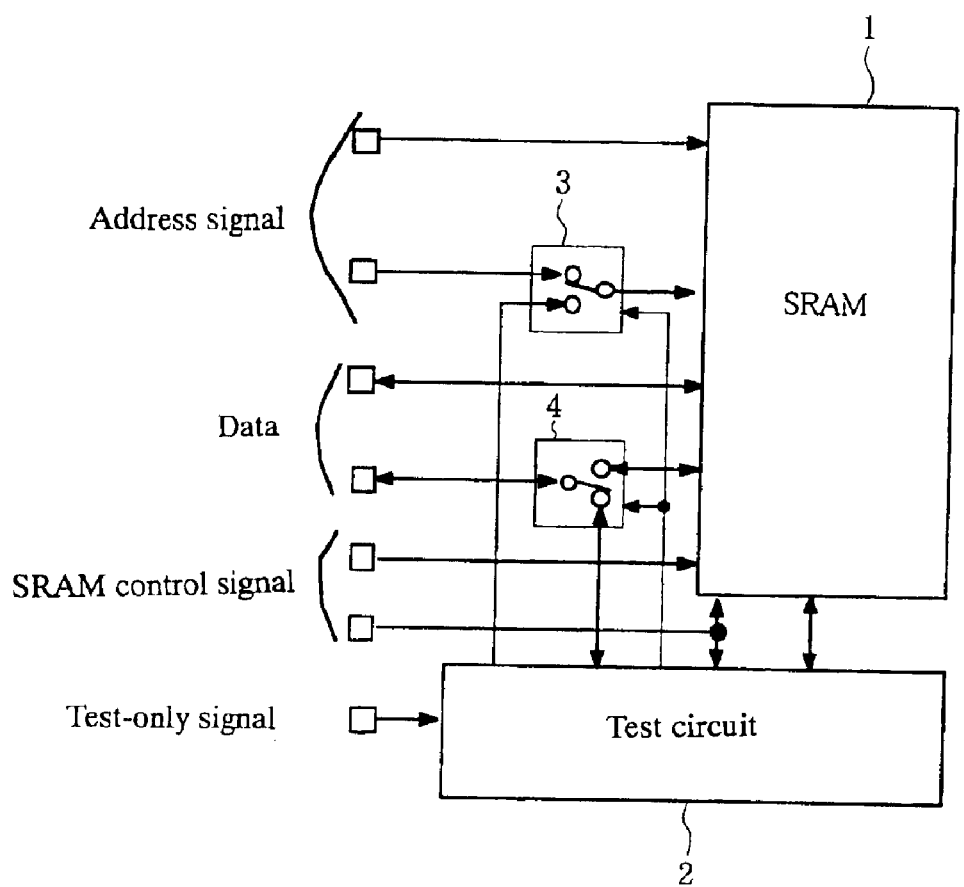
FIG. 1 is a block diagram showing a semiconductor chip that is one embodiment of the present invention.
Figure 2:
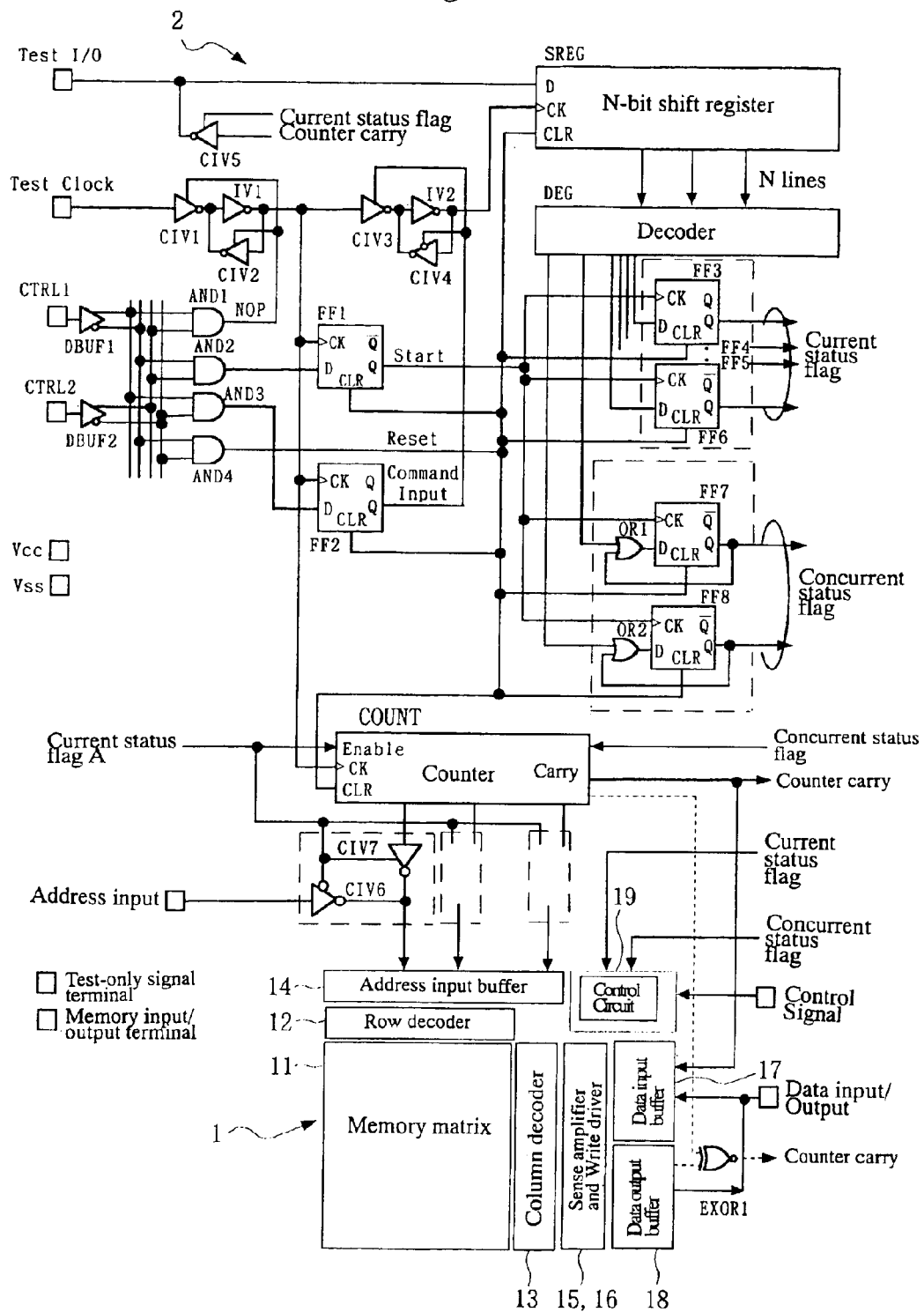
FIG. 2 is a block diagram showing a SRAM and a circuit diagram showing a test circuit according to one embodiment of the present invention.
Figure 5:
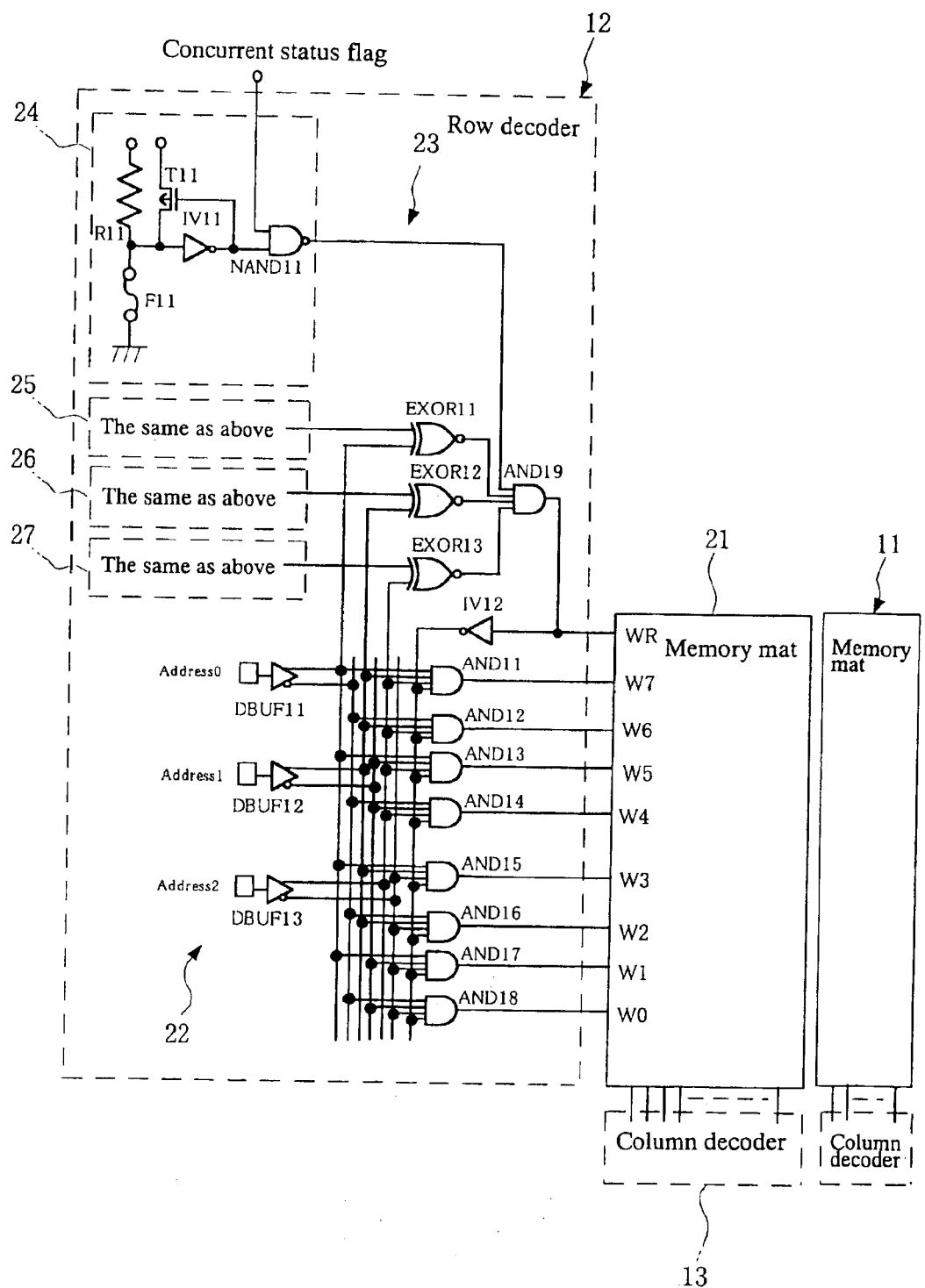
FIG. 5 is a circuit diagram showing a memory matrix of a SRAM and a relief circuit provided in a row decoder according to one embodiment of the present invention.
Figure 6:
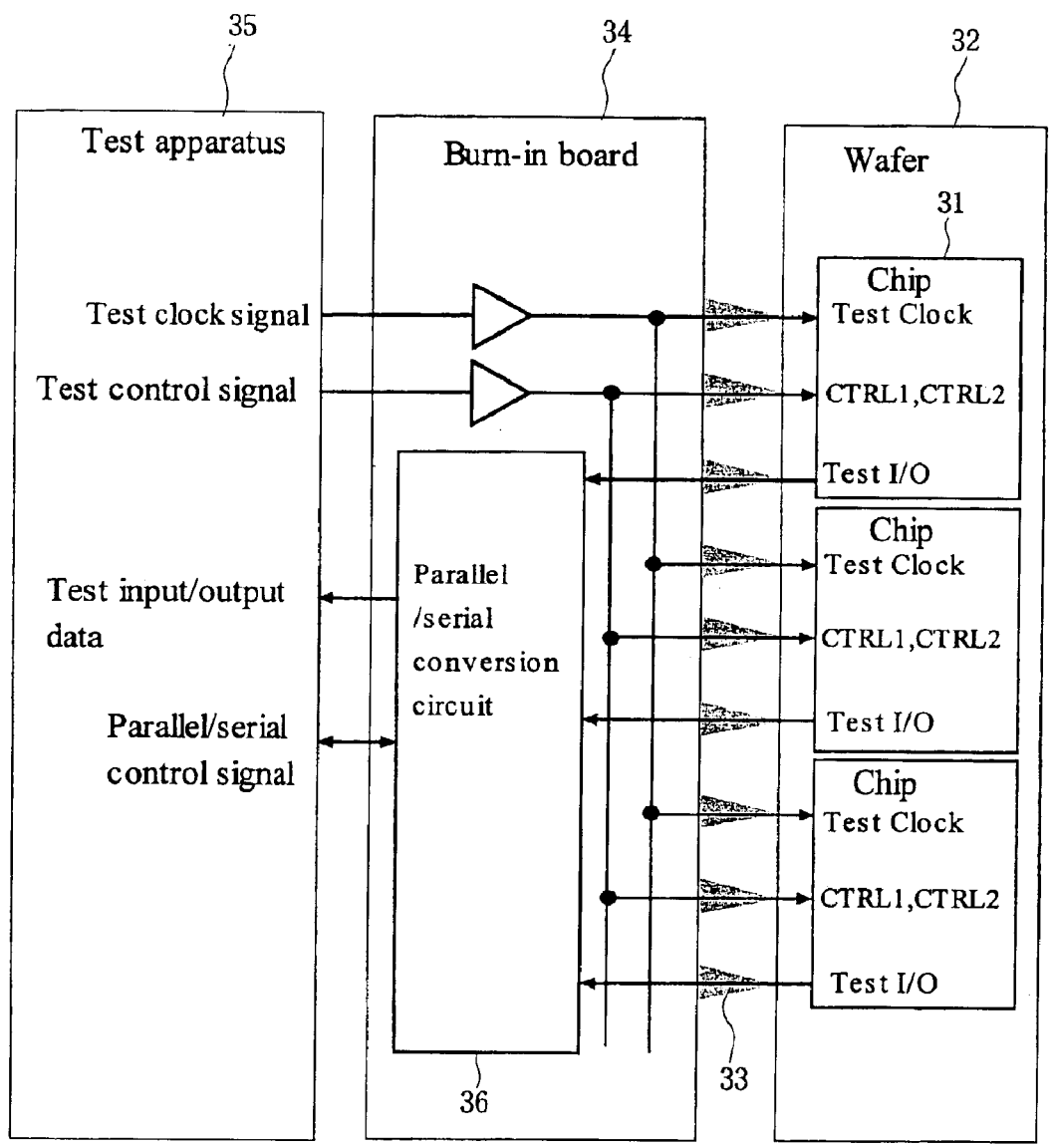
FIG. 6 is a block diagram showing a test system for realizing burn-in of a semiconductor wafer according to one embodiment of the present invention.
Figure 7:
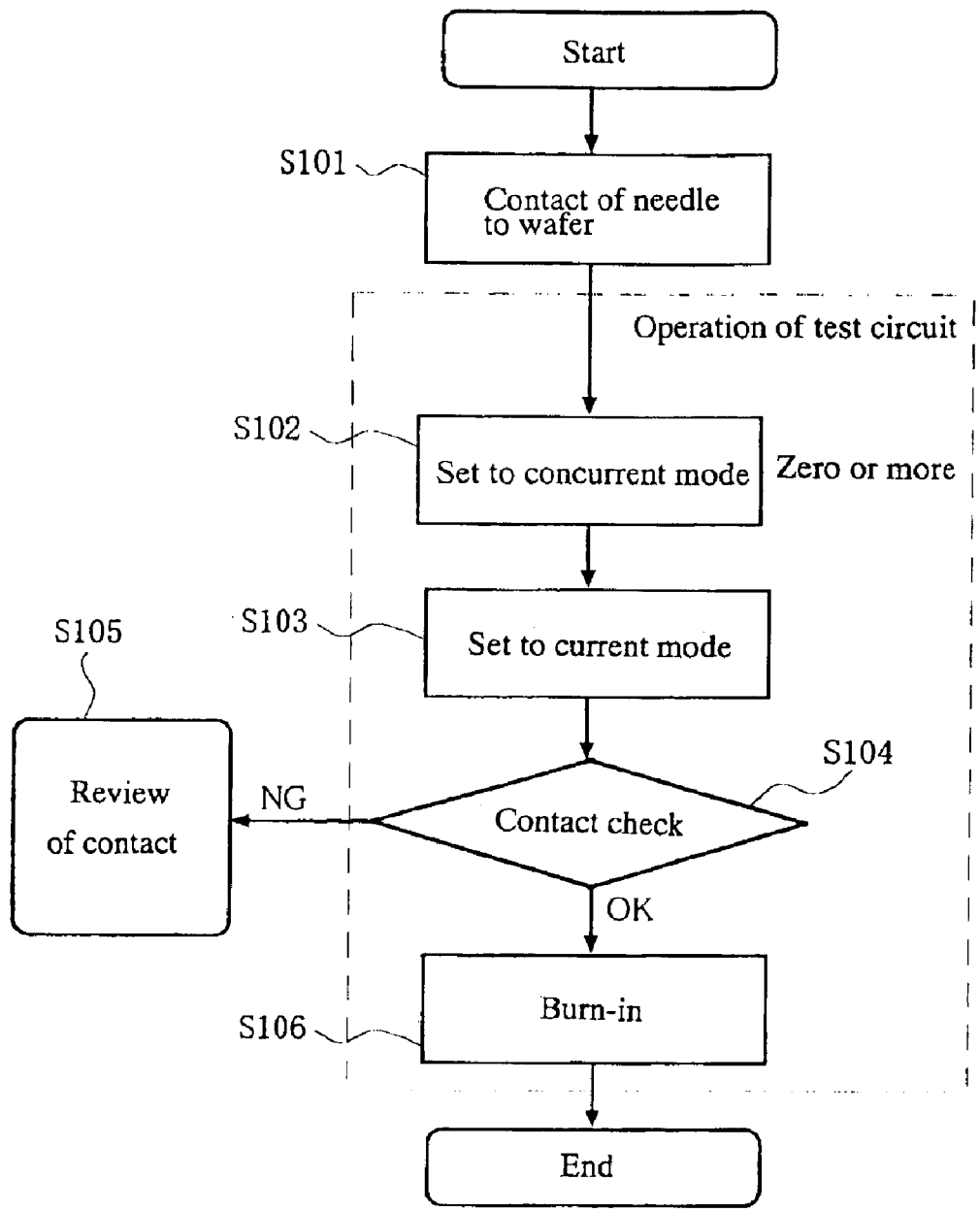
FIG. 7 is a flow diagram showing a burn-in sequence of a semiconductor wafer according to one embodiment of the present invention.
Figure 8:
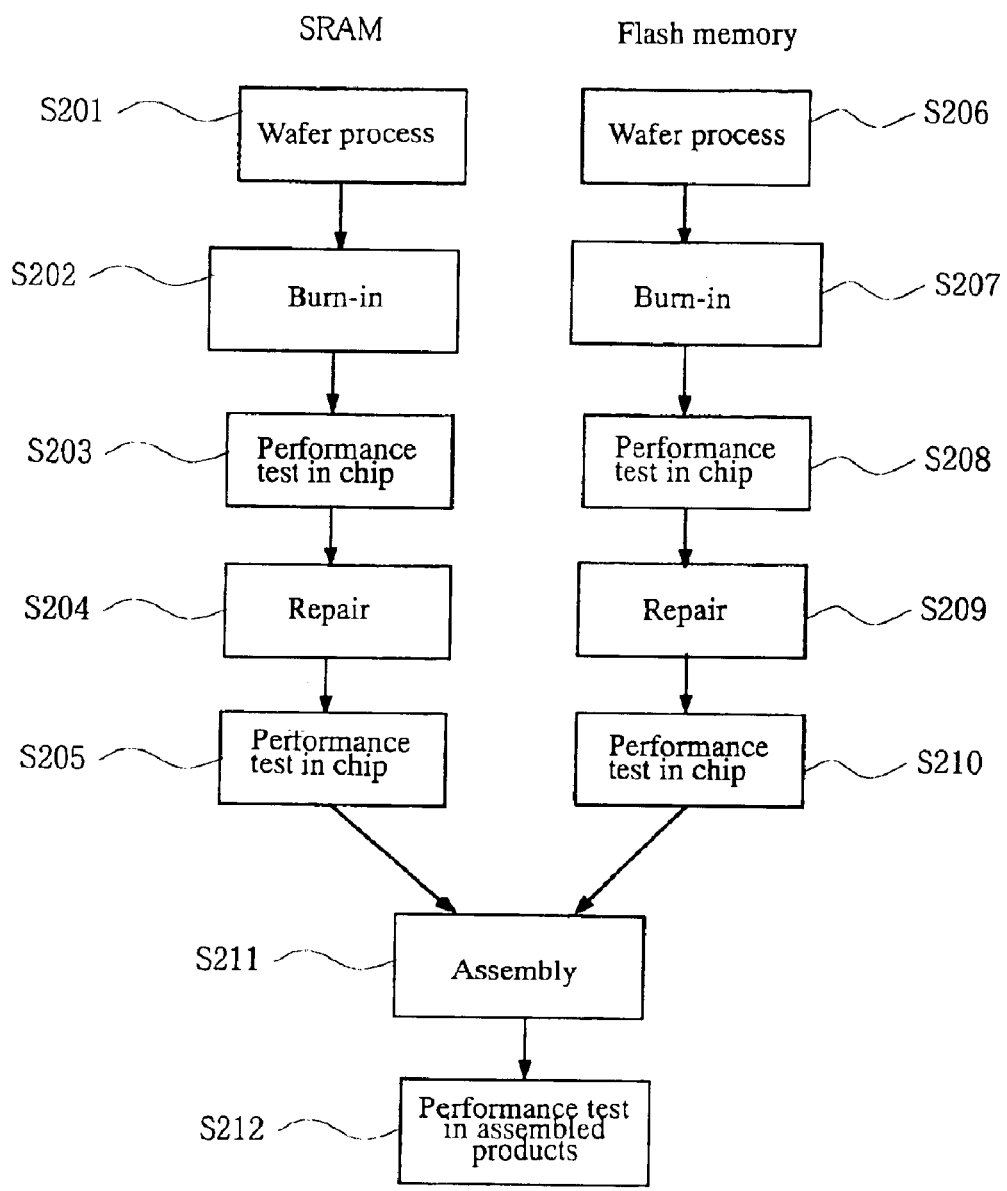
FIG. 8 is a flow diagram showing a production sequence from wafer processing to assembly thereof in case of applying to the burn-in of the semiconductor wafer, according to one embodiment of the present invention.
Figure 9:
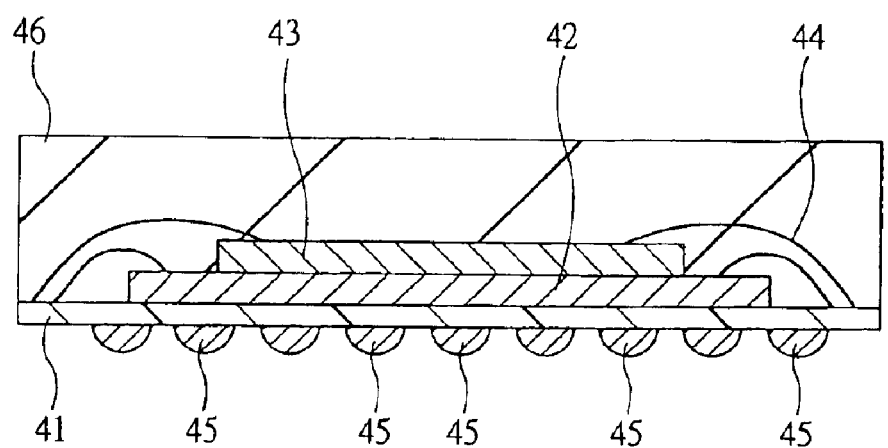
FIG. 9 is a cross-sectional view showing a MCP according to one embodiment of the present invention.
Figure 10:
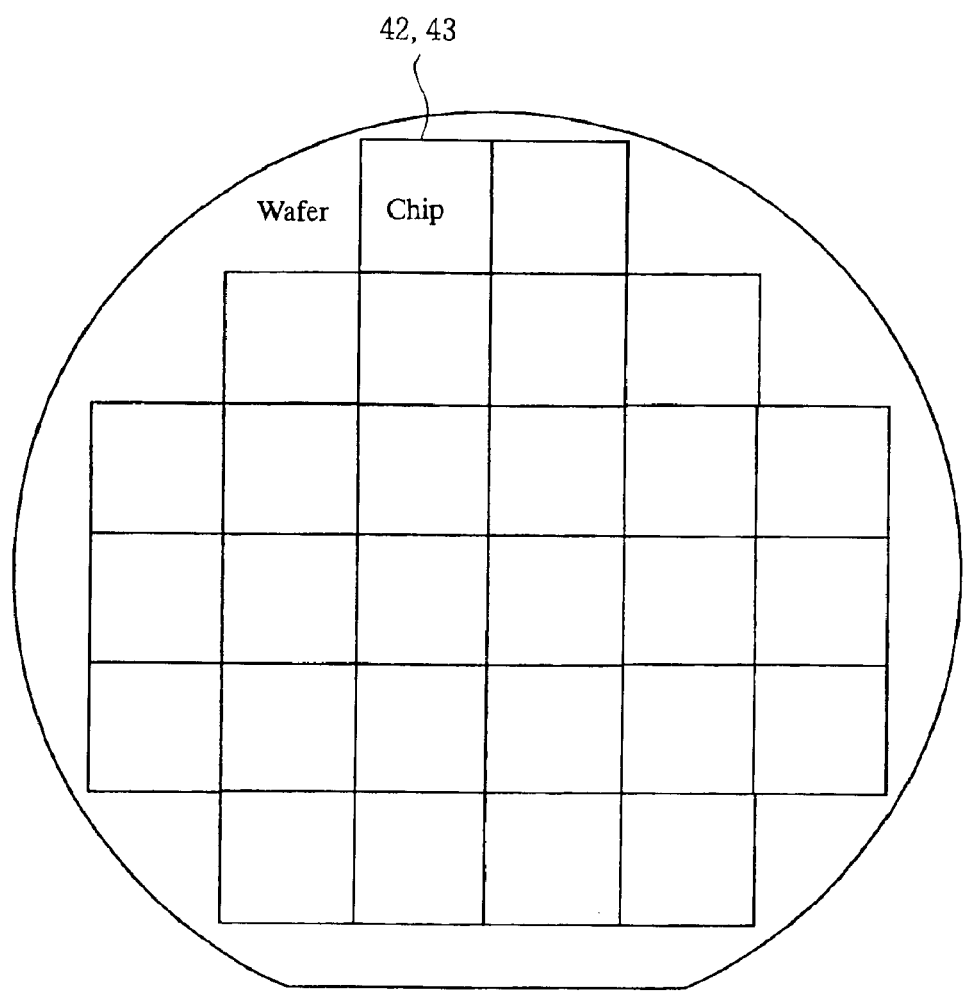
FIG. 10 is a plan view showing a semiconductor wafer according to one embodiment of the present invention.
Figure 11:
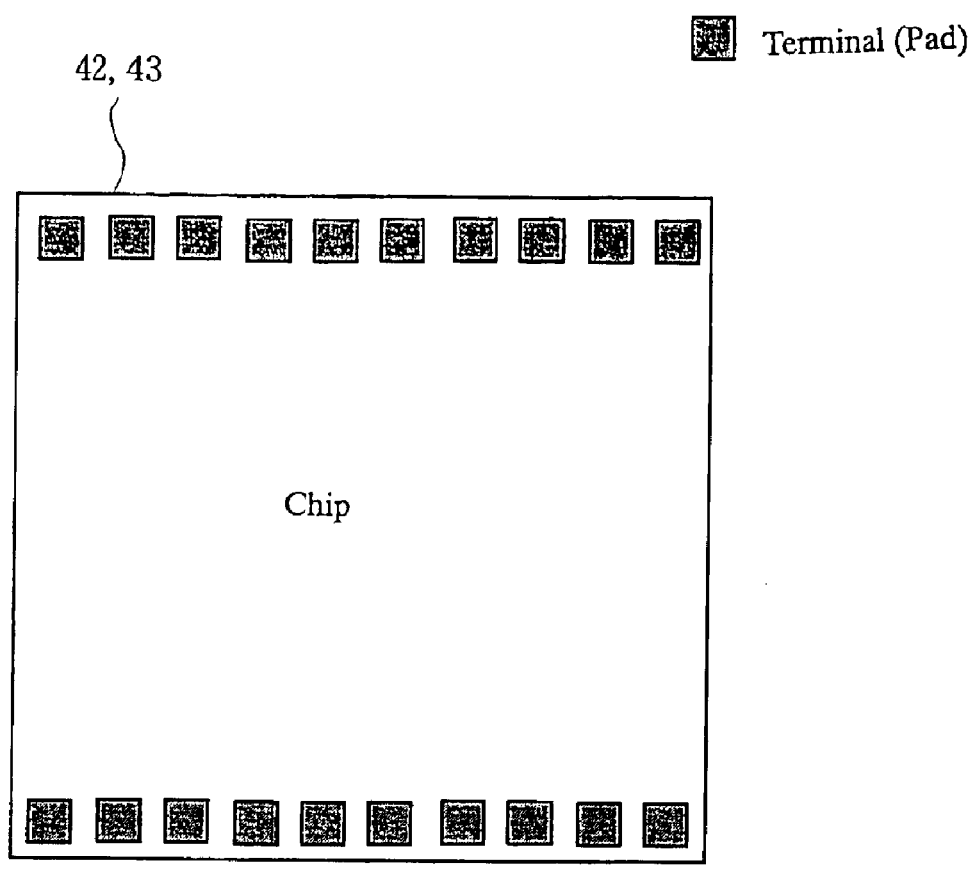
FIG. 11 is a plan view showing a semiconductor chip according to one embodiment of the present invention.
Figure 12:
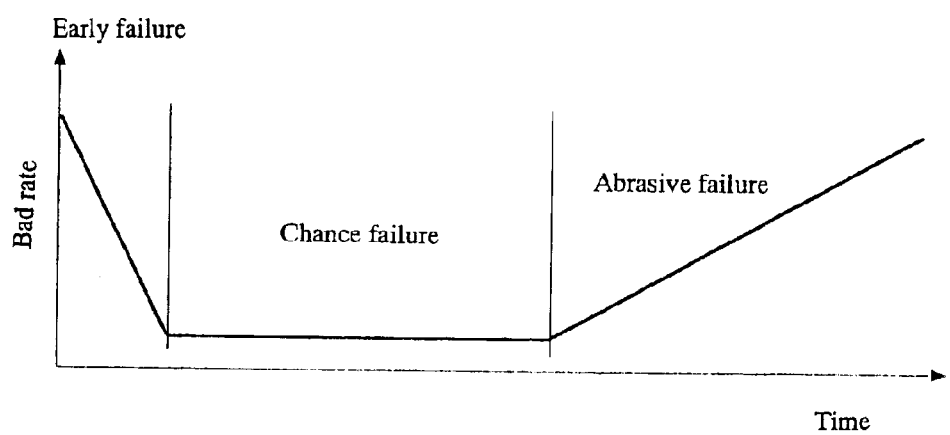
FIG. 12 is a characteristic view showing a change in bad rate according to one embodiment of the present invention.
Figure 13:
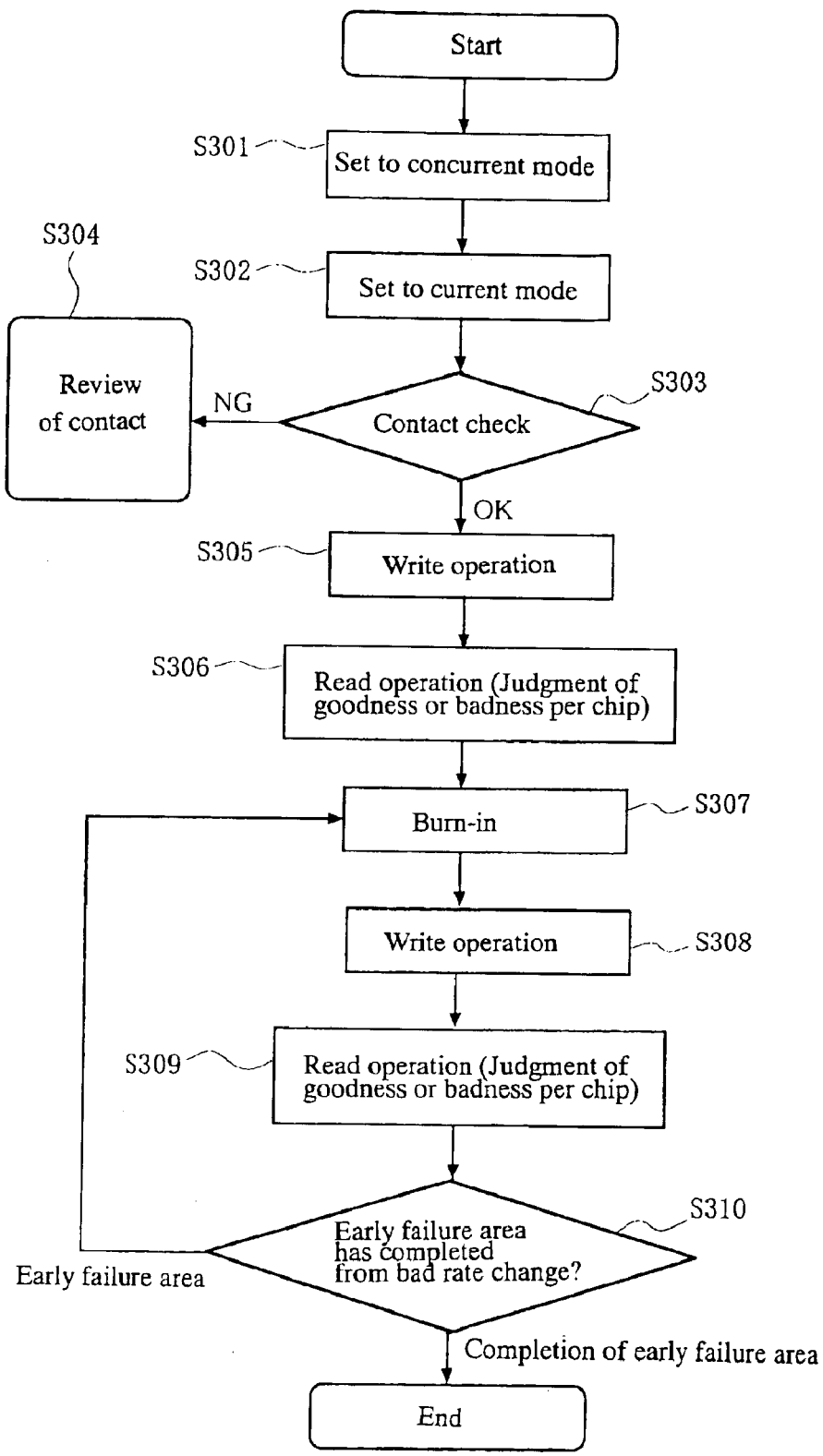
FIG. 13 is a flow diagram showing a burn-in sequence equipped with a monitor function according to one embodiment of the present invention.
Figure 14:
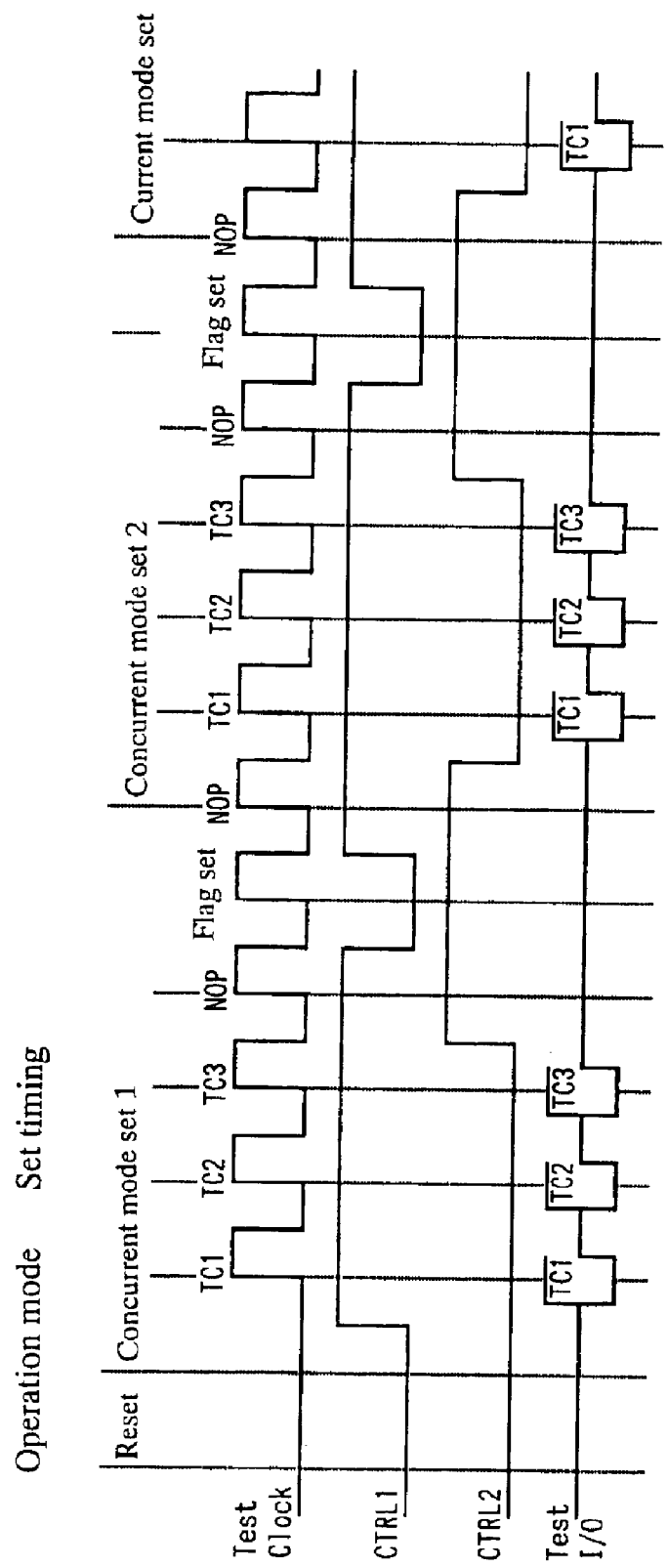
FIG. 14 is a timing diagram showing operation of a test circuit (operation mode set timing) according to one embodiment of the present invention.
Figure 15:
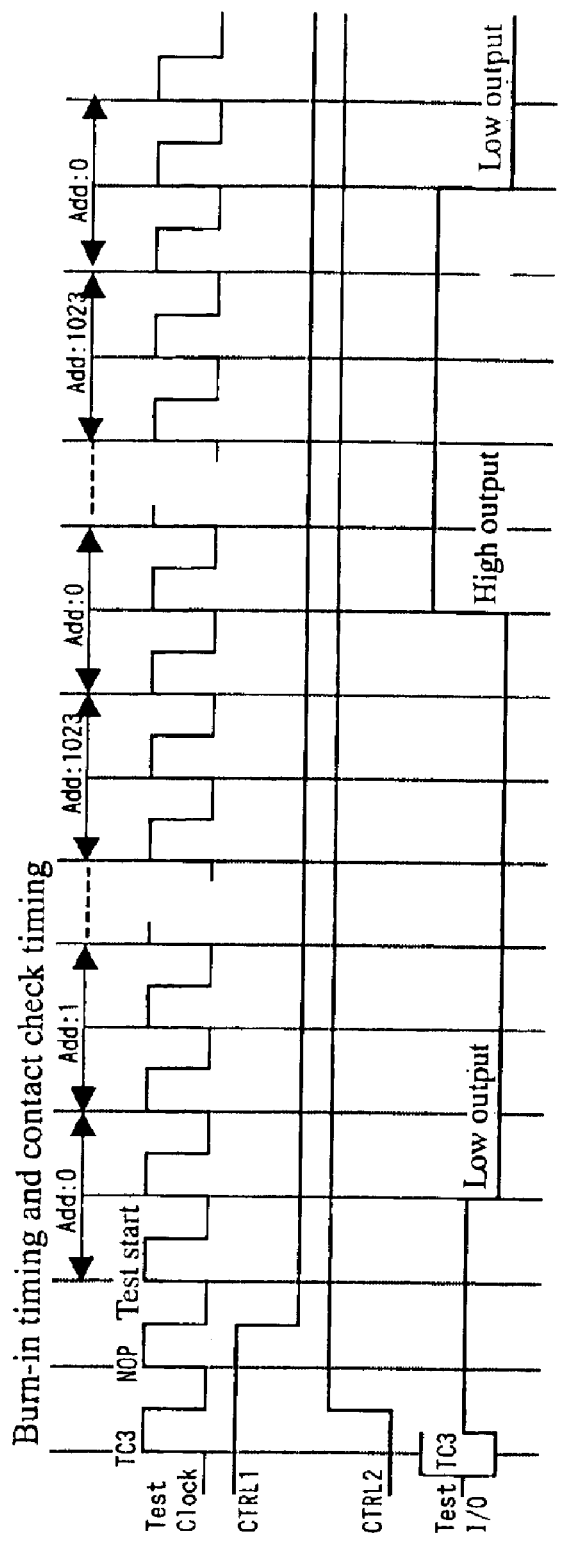
FIG. 15 is a timing diagram showing operation of a test circuit (burn-in and contact check timings) according to one embodiment of the present invention.
Figure 16:
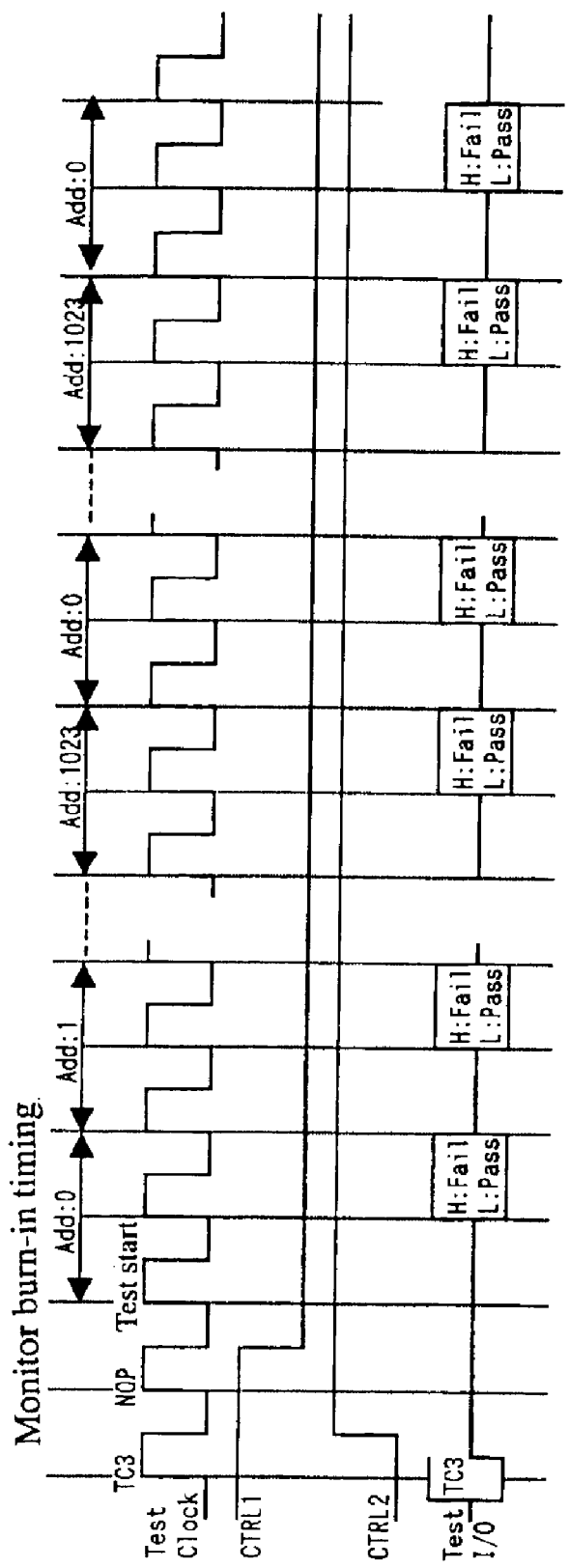
FIG. 16 is a timing diagram showing operation of a test circuit (burn-in timing equipped with a monitor function) according to one embodiment of the present invention.
Figure 17:
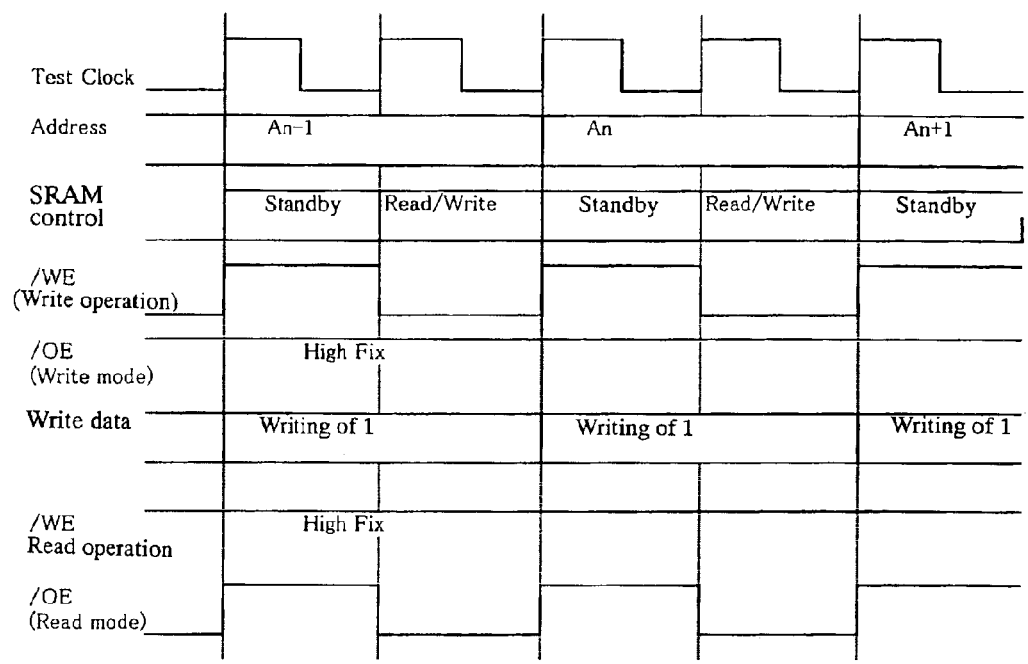
FIG. 17 is a timing diagram showing internal operation at burn-in according to one embodiment of the present invention.
Figure 18:
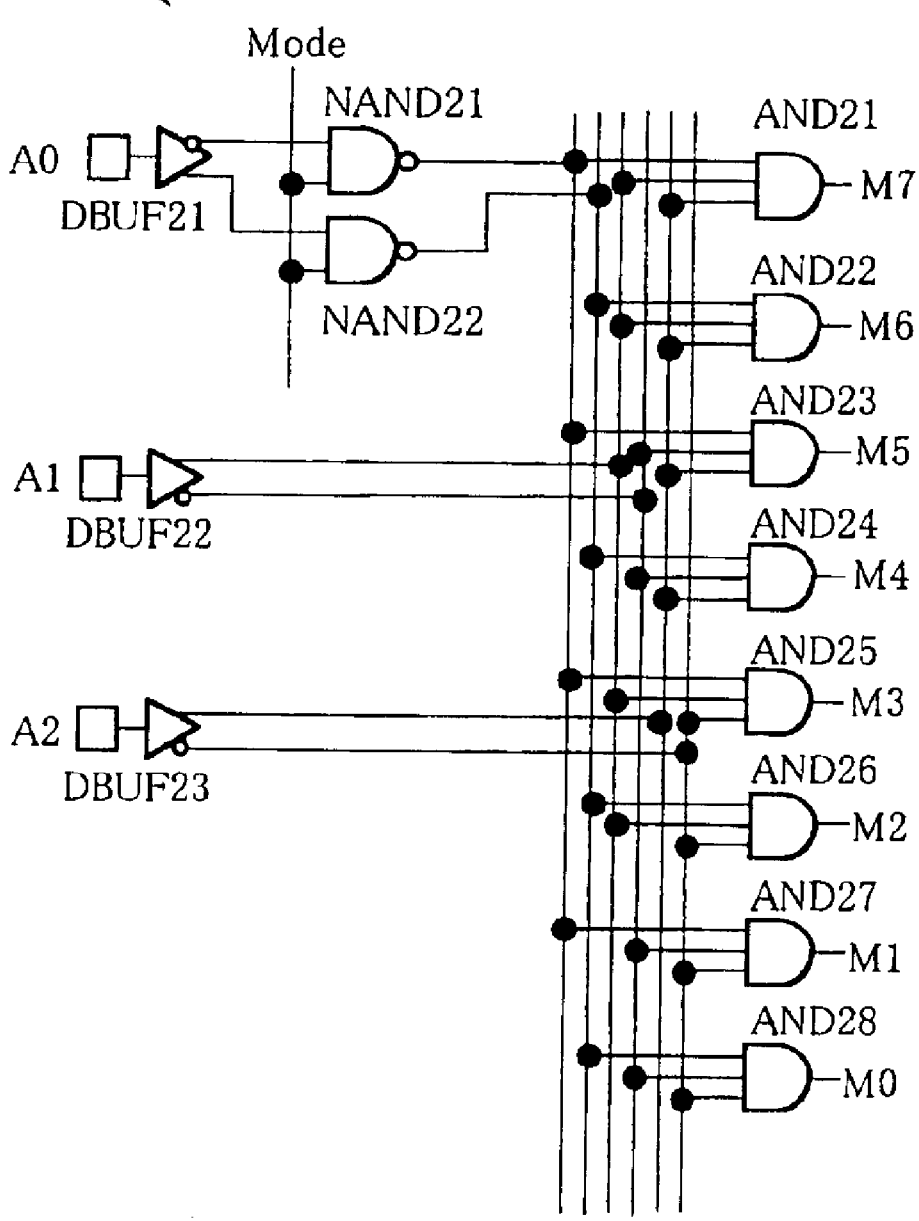
FIG. 18 is a circuit diagram showing a row decoder capable of multiple-choice according to one embodiment of the present invention.
Figure 20:
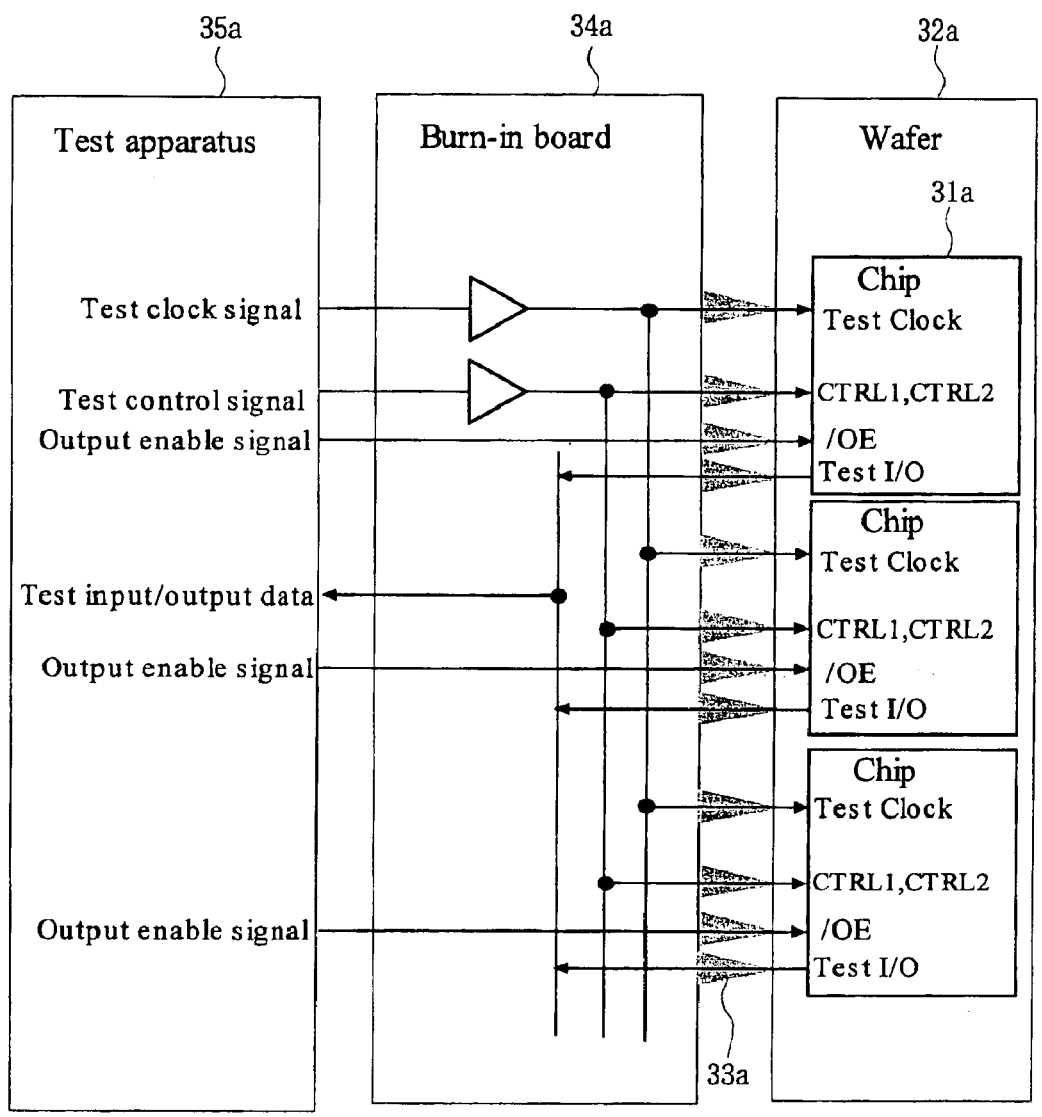
FIG. 20 is a block diagram showing a test system in case of selecting a semiconductor chip by using an output enable signal according to one embodiment of the present invention.

One embodiment of the present invention will be described below with reference to the drawings. FIG. 1 is a block diagram showing a semiconductor chip according to one embodiment of the present invention. FIG. 2 is a circuit diagram showing a block diagram of a SRAM and a circuit diagram showing a test circuit. FIG. 3 is an explanatory view showing a truth value table in the test circuit. FIG. 4 is an explanatory view showing a test command table. FIG. 5 is a circuit diagram showing a memory matrix of the SRAM and a relief circuit in a row decoder. FIG. 6 is a block diagram showing a test system for realizing burn-in of a semiconductor wafer. FIG. 7 is a flow diagram showing a burn-in sequence of the semiconductor wafer. FIG. 8 is a flow diagram showing a production sequence from wafer processing applying to the burn-in of the semiconductor wafer, to assembly thereof. FIG. 9 is a cross-sectional view showing a MCP. FIG. 10 is a plan view showing the semiconductor wafer. FIG. 11 is a plan view showing the semiconductor chip. FIG. 12 is a characteristic view showing a change in bad (defect) rate. FIG. 13 is a flow diagram showing a burn-in sequence equipped with a monitor function. FIGS. 14 to 16 are timing diagrams showing operation of the test circuit. FIG. 17 is a timing diagram showing internal operation at burn-in. FIG. 18 is a circuit diagram showing a row decoder capable of multiple-choice. FIG. 19 is an explanatory view showing a truth value table of a multiple-choice decoder. FIG. 20 is a block diagram showing a test system in case of selecting the semiconductor chip by using an output enable signal.

Firstly, a block construction of a semiconductor chip depicting one example embodiment will be described with reference to FIG. 1.

The semiconductor chip of the present embodiment comprises a SRAM 1 which, for example, is a memory circuit having a volatile memory matrix, and a test circuit 2 for performing burn-in of this SRAM 1, two selectors 3 and 4, and the like formed therein.

The semiconductor chip is provided with an address input terminal for inputting an address signal, a data input/output terminal for inputting/outputting data, a SRAM control signal terminal for inputting a control signal, a test-only signal terminal for inputting a test-only signal, and the like therein.

In this semiconductor chip, normal memory input and output operations can select an optional memory cell of the SRAM 1 by an address signal being input from the address input terminal, can write data being input from the data input/output terminal relative to this selected memory cell, and can output data, which is read out from the memory cell, from the data input/output terminal. These write and read operations are controlled by a control signal being input from the SRAM control signal terminal.

Moreover, testing operation can operate the test circuit 2 by the test-only signal being output from the test-only signal terminal, change the selectors 3 and 4 to select an optional memory cell of the SRAM 1 in accordance with the address signal generated by the test circuit 2, and write data generated by the test circuit 2 in the selected memory cell or take data read out from the memory cell in the test circuit 2. These write and read operations are controlled by a control signal generated by the test circuit 2.

Next, a block constitution showing one example of the SRAM 1 and a circuit constitution showing one example of the test circuit 2 will be described with reference to FIG. 2.

The SRAM 1 comprises a memory matrix 11, a row decoder in 12, a column decoder 13, an address input buffer 14, a sense amplifier 15, a write driver 16, a data input buffer 17, a data output buffer 18, a control circuit 19, and the like. As memory input/output terminals for this SRAM 1, there are provided an address input terminal, a data input/output terminal, a control signal terminal, and the like. Normal memory input and output operations relative to this SRAM 1 take an address signal being input from the address input terminal in the address input buffer 14, and select an optional memory cell in the memory matrix 11 by a row address obtained by decoding the row decoder 12 and a column address obtained by decoding the column decoder 13 on the basis of this address signal. Then, in case where the write operation is performed for the selected memory cell, write data being input from the data input/output terminal is taken in the data input buffer 17, and the write data is written in the memory cell via the write driver 16. And, in case where the read operation is performed from the selected memory cell, data being read out from the memory cell is taken in the data output buffer 18 via the sense amplifier 15, and this read data is output from the data input/output terminal. These write and read operations are controlled on the basis of the control signal being input from the control signal terminal into the control circuit 19.

The test circuit 2 is a circuit having a function for inputting a signal for judging electric connection/non-connection between a needle connected to a test apparatus and a terminal of the semiconductor chip at burn-in, and for outputting a response signal responding to this input signal to thereby judge the electric connection/non-connection between the needle connected to the test apparatus and the terminal of the semiconductor chip. And, the test circuit 2 comprises an N-bit shift register SREG, a decoder DEC, a counter COUNT, a plurality of flip-flops FF1 to FF8, clocked inverters CIV1 to CIV7, inverters IV1 to 1V2, AND gates AND1 to AND4, OR gates OR1 and OR2, buffers DBUF1 and DBUF2, and the like. Each of the buffers DBUF1 and DBUF2 outputs an output signal having the same phase relative to the input signal, and a substantially phase-inverted output signal relative to this output signal. As test-only signal terminals for this test circuit 2, there are provided a test clock terminal for inputting a test clock signal "Test Clock", a test control terminal for inputting each of test control signals "CTRL1" and "CTRL2", a test input/output terminal for inputting and outputting test input/output data "Test I/O", a power terminal for supplying a power supply voltage Vcc, an earth terminal for supplying an earth voltage Vss, and the like. This test circuit 2 has a logical composition capable of realizing operation as shown in FIGS. 3 and 4, as an input/output of the test input/output data Test I/O (command input) from the test input/output terminal by synchronizing the test clock signal "Test Clock" from the test clock terminal and by controlling the test control signals "CTRL1" and "CTRL2" from each of the test control terminals. Firstly, the operation will be described by using a truth value table of the test circuit 2 shown in FIG. 3.

(1) In "L" or "H" of the test clock signal "Test Clock", when the test control signals "CTRL1" and "CTRL2" are both "0", the command register is reset to 000. In this case, the test input/output data Test I/O is 1 or 0. Status in this case becomes a normal SRAM operation state of resetting the test circuit 2 and deactivating the test circuit 2.

That is, in this case, when the test clock signal "Test Clock" and the test control signals "CTRL1" and "CTRL2" are in the conditions described above, a reset signal "Reset" is output from the AND gate AND4 and is input in input terminals CLR of the shift register SREG, the counter COUNT, and the flip-flops FF1 to FF8. In this manner, when the reset signal "Reset" is established, the shift register SREG, the counter COUNT, and the flip-flops FF1 to FF8 are reset, respectively. This reset signal "Reset" is used for initial setting.

(2) During change of the test clock signal "Test Clock" from "L" to "H", in case where the test control signal "CTRL1" is "0" and the test control signal "CTRL2" is "1", a command being input in the command register is set. In this case, the test input/output data "Test I/O is "1" or "0". The status of this case becomes an operation-starting state of the test circuit 2.

That is, in this case, when the test clock signal "Test Clock" and the test control signals "CTRL1" and "CTRL2" are under the condition described above, a start signal "Start" is output from the output terminal Q of the flip-flop FF1 and is input in the input terminals CK of the flip-flops FF3 to FF8. This flip-flop FF1 operates to synchronize the test clock signal "Test Clock" being input in the input terminal CK, and outputs the start signal "Start" based on the signal being input in the input terminal D through the AND gate AND2. In this manner, when the start signal "Start" is established, the flip-flops FF3 to FF8 become operable and thereby start the operation of the test circuit 2.

(3) During change of the test clock signal "Test Clock" from "L" to "H", in case where the test control signal "CTRL1" is "1" and the test control signal "CTRL2" is "0", a command is input as the test input/output data "Test I/O, and the test input/output data "Test I/O is input in the command register. The status of this case becomes a test command-receiving state.

That is, in this case, when the test clock signal "Test Clock" and the test control signals "CTRL1" and "CTRL2"

are under the condition described above, a command input signal "Command Input" is output from the output terminal Q of the flip-flop FF2, and the clocked inverters CIV3 and CIV4, in which the test clock signal "Test Clock" is input, on a path to the input terminal CK of the shift register SREG are controlled. This flip-flop FF2 operates to synchronize the test clock signal "Test Clock" being input in the input terminal CK and output a command input signal "Command Input" on the basis of the signal being input in the input terminal D through the AND gate AND3. At the same time, the test input/output data "Test I/O" is input in the input terminal D of the shift register SREG. Then, for example, a signal having three bits is input in the decoder DEC from the shift register SREG, and is decoded by this decoder DEC, and is input in each input terminal D of the flip-flops FF3 to FF8. In this manner, when the command input signal "Command Input" is established, a test command is input in the shift register SREG by the serial input of the test input/output data "Test I/O", and a current status flag is established by a signal being output from each output terminal Q of the flip-flops FF3 to FF6 or a concurrent status flag is established by a signal being output from each output terminal Q of the flip-flops FF7 and FF8, and operations based on the respective status flags start. The current status flag is used as an enable signal for the counter COUNT, a control signal for the control circuit 19 of the SRAM 1, and a control signal for the clocked inverter CIV5. The concurrent status flag is used as a control signal for the control circuit 19 of the SRAM1. The test command will be described hereinafter with reference to FIG. 4.

Moreover, by establishment of the current status flag A, this signal is input in an input terminal "Enable" of the counter COUNT and, at the same time, the clocked inverters CIV6 and CIV7 in a path connected between the counter COUNT and the SRAM 1 are controlled. As described above, when the current status flag A is established, the counter COUNT synchronizing the test clock signal "Test Clock" starts operating, and a carry signal of the counter COUNT starts to output the test input/output data "Test I/O" relating to goodness or badness of burn-in, from the test input/output terminal through the clocked inverter CIV5. In this output signal, contact check results and the like include judgment of electric connection/non-connection between each needle and each of the test-only signal terminals that include these terminals. In addition, a count value of the counter COUNT is input in an address input buffer 14 of the SRAM 1 through the clocked inverter CIV6 and CIV7, and write and read operations relative to an optional memory cell in the memory matrix 11 selected by the address signal based on this count value. In this write operation, the carry signal of the counter COUNT is used as the write data through the data input buffer 17 and the write driver 16.

(4) During change in the test clock signal "Test Clock" from "L" to "H", in case where the test control signals "CTRL1" and "CTRL2" are both "1", the command register does not change. Moreover, in this case, the test input/output data "Test I/O" is "1" or "0". The status of this case becomes no operation (NOP) state.

That is, in this case, when the test clock signal "Test Clock" and the test control signals "CTRL1" and "CTRL2" are under the condition described above, a no operation signal "NOP" is output from the AND gate AND1, and the clocked inverters CIV1 and CIV2 on a path in which the test clock signal "Test Clock" is input are controlled. In this manner, when being established, the no operation signal "NOP" does not transmit the test clock signal "Test Clock" therein.

Subsequently, a test mode in a state of receiving the above-described test command will be described by using the test command table of FIG. 4.

(11) In case where the test mode is the current mode, and the test command is all "0" in a first cycle ($1^{st}$Cyc), a second cycle (2nd·Cyc) and a third cycle (3rd·Cyc), the status of the test circuit 2 is a deactivated state thereof, and a function of the test input/output data "Test I/O" during the test mode becomes a memory input/output data. That is, at this time, it is a normal SRAM operation state.

(12) In case where the test mode is the current mode, and the test command is "0" in the first and second cycles and "1" in the third cycle, the status of the test circuit 2 is a burn-in write (Write) operation state, and a function of the test input/output data "Test I/O" at the test mode becomes borrow output of the address counter COUNT. At this time, the write operation is performed in the burn-in sequence shown in FIG. 7 and described hereinafter.

(13) In case where the test mode is the current mode, and the test command is "0" in the first cycle, "1" in the second cycle, and "0" in the third cycle, the status of the test circuit 2 is the burn-in read (Read) operation state, and the function of the test input/output data "Test I/O" at the test mode becomes borrow output of the address counter COUNT. At this time, the read operation is performed in the burn-in sequence shown in FIG. 7 and described hereinafter.

(14) In case where the test mode is the current mode, and the test command is "0" in the first cycle and "1" in the second and third cycles, the status of the test circuit 2 is a monitor burn-in operation state, and the function of the test input/output data "Test I/O" at the test mode becomes pass (Pass) output at "0" and fail (Fail) output at "1". At this time, the burn-in sequence equipped with monitor function, shown in FIG. 13 and described hereinafter, is performed.

(15) In case where the test mode is the concurrent mode, and the test command is "1" in the first cycle and "0" in the second and third cycles, the status of the test circuit 2 is in such a state that a multiple-choice mode flag is established and the function of the test input/output "data Test I/O" at the test mode becomes the same as the above-mentioned current mode. At this time, a decoder capable of multiple-choice is used as shown in FIG. 18 and described hereinafter.

(16) In case where the test mode is the concurrent mode, and the test command is "1" in the first cycle, "0" in the second cycle, and "1" in the third cycle, the status of the test circuit 2 is in such a state that a redundant bit test mode flag is established and the function of the test input/output data "Test I/O" at the test mode becomes the same as the above-mentioned current mode. At this time, a relief circuit in the decoder shown in FIG. 5 and described hereinafter is used.

(17) In case where the test mode is the concurrent mode, and the test command is "1" in the first and second cycles and "0" in the third cycle, or "1" in the first, second and third cycles, the status of the test circuit 2 is the outside regulated state thereof.

Next, both the memory matrix 11 of the SRAM 1 and one circuit constitution example of the relief circuit provided in the row decoder 12 will be described with reference to FIG. 5.

Here, an example in which row selection lines W0 to W7 of one memory mat 21 in the memory matrix 11 are selected by the row decoder 12 will be described. WR denotes a row selection line for redundant relief. The row decoder 12 comprises a decode circuit 22 for decoding address signals "Address 0" to "Address 2" being input to select one of the row selection lines W0 to W7, a redundant relief circuit 23 for selecting the redundant relief row selection line WR in order to relieve a bad bit, and the like. The decode circuit 22 comprises a plurality of buffers DBUF11 to DBUF13, a plurality of AND gates AND11 to AND18, and the like. The redundant relief circuit 23 comprises four groups of relief circuits 24 to 27, EXOR gates EXOR11 to EXOR13, an AND gate AND19, an inverter IV12, and the like. Each of four groups of relief circuits 24 to 27 includes a fuse F11, a MOS transistor T11, a resistance R11, inverter IV11, and a NAND gate NAND11. Among the four groups of relief circuits 24 to 27, one group of relief circuit 24 is for redundant relief activation/deactivation, and the other three groups of relief circuits 25 to 27 are for redundant relief address.

This row decoder 12 operates to decode the address signals "Address 0" to "Address 2" being input, activate one of the row selection lines W0 to W7 in the memory mat 21, and select a memory cell connected to these row selection lines W0 toW7. For example, in the test stage, in case where a memory cell connected to the row selection line W0 among the row selection lines W0 to W7 happens to become bad, all the fuses 11 of the relief circuits 24 to 27 are cut which are for redundant relief activation/deactivation and for redundant relief address. That is, in case of cutting the fuse F11 in the relief circuit 24 for redundant relief activation/deactivation, and cutting the fuses F11 in the relief circuits 25 to 27 for redundant relief address corresponding to the redundant relief address signal (for example, a bit corresponding to the row selection line W0), if the corresponding redundant relief address is selected, the corresponding row selection line W0 becomes unselected. At the same time, a row selection line WR for redundant relief is selected, and a redundant relief memory cell connected to the row selection line WR for redundant relief can be used instead of the bad memory cell connected to the row selection line W0.

One example is described in which one of the row selection lines W0 to W7 in the memory mat 21 is selected by the row decoder 12 hereinbefore. However, by performing similar redundant relief processing relative to both the column decoder 13 for decoding the address signal being input and selecting one column selection line and the mat decoder for selecting one mat selection line, the column selection line and the mat selection line in the memory mat 21 can be changed to a redundant type.

Moreover, in case where the redundant relief memory cell in the memory mat 21 is tested by using the test circuit 2, a redundant bit test mode ("1" normal operation mode) depending on "0" of the concurrent status flag being input in one of the NAND gate NAND11 creates the same state as a state of cutting the fuses F11 in the relief circuits 24 to 27 for redundant relief activation/deactivation and for redundant relief address, and can perform the write and read operations relative to the redundant relief memory cell, similarly to the normal memory cell.

Next, one example of a block constitution of the test system for realizing burn-in of the semiconductor wafer will be described with reference to FIG. 6.

The test system comprises a semiconductor wafer 32, a burn-in board 34, a test apparatus 35, and the like. The semiconductor wafer 32 comprises a plurality of semiconductor chips 31 having the above-described SRAM 1 and test circuit 2 formed therein. The burn-in board 34 performs burn-in by bringing a needle 33 into contact with a terminal (pad) of each semiconductor chip 31 in this semiconductor wafer 32. The test apparatus 35 inputs and outputs various signals such as a test clock signal for burn-in, a test control signal, and a test input/output data. The burn-in board 34 has a parallel/serial conversion circuit 36 formed therein for converting parallel data for test input/output data being output from each semiconductor chip 31, into serial data, and for outputting the converted data to the test apparatus 35.

In this test system, the test clock signal and the test control signal generated in the test apparatus 35 are supplied to each semiconductor chip 31 of the semiconductor wafer 32, via each buffer in the burn-in board 34. And, the test input/output data being output from each semiconductor chip 31 is converted from parallel data to serial data by the parallel/serial conversion circuit 36 in the burn-in board 34, and then is taken in the test apparatus 35. Both controls of the test apparatus 35 and the parallel/serial conversion circuit 36 in the burn-in board 34 are performed on the basis of the parallel/serial control signal.

Next, one example of the flow in the burn-in sequence of the semiconductor wafer 32 will be described with reference to FIG. 7.

Firstly, at the start of the burn-in, needles 33 of the burn-in board 34 are respectively brought into contact with terminals on each semiconductor chip 31 of the semiconductor wafer 32 (a step S101).

Moreover, when various signals from the test apparatus 35 are supplied to each semiconductor chip 31 of the semiconductor wafer 32, the test circuit 2 in each semiconductor chip 31 is operated. During an operation state of this test circuit 2, the concurrent mode is firstly set (a step S102), subsequently the current mode is set (a step S103), and then a Contact check is performed for checking electric connection/non-connection between each terminal of each semiconductor chip 31 and each needle 33 (a step S104).

As a result of this contact check, in case where an electric connection is not made (NG) between each terminal of each semiconductor chip 31 and each needle 33, the contact is reviewed (a step S105). On the other hand, in case where an electric connection is made (OK) between each terminal of each semiconductor chip 31 and each needle 33, temperature and voltage stress exceeding a rating are applied to thereby perform burn-in (a step S106). As one example, at burn-in, a high temperature of about 125° C. and a high voltage of about 5V are applied if it is a 3.3V product. When this burn-in is finished, the burn-in sequence is completed.

Next, in case where the burn-in of the semiconductor wafer 32 is applied, one example of flow of production sequence from wafer processing to assembly thereof will be described with reference to FIG. 8. Here, an explanation will be made of an example of a MCP having a packaging structure in which two semiconductor chips are formed, one being a volatile SRAM 1 including the above-described test circuit 2, and the other being a nonvolatile semiconductor chip which is different kind from this semiconductor chip. The present invention is not limited to a structure having two different kinds of semiconductor chips as described above, and preferably has such a structure that at least two semiconductor chips are formed.

As one example, the MCP has a structure in cross section as shown in FIG. 9. That is, this MCP comprises a substrate 41, a volatile SRAM semiconductor chip 42 formed on this substrate 41, a nonvolatile flash memory semiconductor chip 43 formed on this SRAM semiconductor chip 42, wires 44 for connecting each terminal (pad) of the semiconductor chips 42 and 43 to each terminal (pad) on the substrate 41, balls 45 which are electrically connected to the terminals on the substrate 41 via a wiring pattern and a through hole and which serve as external terminals arranged on the backside of the substrate 41, a resin 46 for molding the semiconductor chips 42 and 43 and the wires 44, and the like. The structure of the MCP is not limited to this structure.

At first, regarding the SRAM semiconductor chip 42, in a wafer processing step of the semiconductor chip, after wafer processing such as oxidation, diffusion, impurity introduction, formation of a wiring pattern, formation of an insulating layer, formation of a wiring layer, and the like is repeated to form a desired circuit (a step S201). Then, Burn-in shown in FIG. 7 is performed (a step S202) to identify a semiconductor chip 42 being likely to become bad in future, and this semiconductor chip 42 is repaired in a repair step described hereinafter. Then, the good semiconductor chip 42 obtained after the burn-in is subjected to a performance test (a step S203). This performance test includes a function test, an open/short inspection between input/output terminals, a leakage current inspection, a DC test such as measurement of power supply current, an AC test, and the like. The function test examines the memory function by using a predetermined test pattern, for example, the write and read operations with respect to the SRAM, and thereby confirms operation or non-operation based on given functions. The AC test examines an AC timing of the SRAM control.

As a result of this performance test, regarding the bad semiconductor chips 42, the test result thereof is analyzed to find a bad bit, and redundant relief processing to this bad bit is performed by the above-described redundant relief circuit 23 to carry out the repair (a step S204). In this repair step, the repair is also performed in a similar manner to the semiconductor chips 42 identified as bad ones at the burn-in.

Moreover, after the repair, the performance test in the semiconductor chips 42 is again performed (a step S205) to thereby confirm that the bad bit is changed to the redundant relief bit by the redundant relief processing. Thereby, the wafer processing steps in the stage of the semiconductor wafer is completed relative to the SRAM semiconductor chip 42 to obtain a semiconductor wafer on which a plurality of SRAM semiconductor chips 42 generated after the burn-in are formed.

Similarly, regarding the flash memory semiconductor chips 43, in the wafer processing steps of the semiconductor wafer, after a desired circuit is formed by repeating wafer processing (a step S206), the burn-in (a step S207), the performance test (a step S208), the repair (a step S209), and the performance test (a step S210) are respectively performed. Thereby, the semiconductor wafer is obtained on which a plurality of flash memory semiconductor chips 43 generated after the burn-in are formed.

Subsequently, the assembly process of the MCP is performed. Firstly, the SRAM semiconductor wafer and the flash memory semiconductor wafer which are generated after completion of the wafer processing steps, as described above, are cut and separated into individual semiconductor chips, and respectively prepare the SRAM semiconductor chip 42 and the flash memory semiconductor chip 43 which are divided into individual semiconductor chips.

As one example, the state of a semiconductor wafer has a plan structure as shown in FIG. 10, and a state of the cut semiconductor chips 42 and 43 has a plan structure as shown in FIG. 11. However, in FIGS. 10 and 11, for the sake of clarity of the drawing, the number of the semiconductor chips 42 and 43 formed on the semiconductor wafer and the number of terminals provided in the semiconductor chips 42 and 43 are shown in a fewer number than the actual number. For example, as one example, the semiconductor wafer may have 540 semiconductor chips 42 and 43, and the semiconductor chips may have 50 terminals, and the like. In this semiconductor chip 42 and 43, the terminals are arranged on two sides in the circumference, but, needless to say, the layout of the terminals may include other arrangements such as arrangements dispersed on the four sides in the circumference (periphery) or along a central line or the like, and so forth.

Thereafter, there are performed die bonding for forming the SRAM semiconductor chip 42 and the flash memory semiconductor chip 43 on the substrate 41, wire bonding for electrically connecting the terminals of the semiconductor chips 42 and 43 to the terminals on the substrate 41 by means of a wire 44, resin molding for molding the semiconductor chips 42 and 43 and the wire 44 by a resin 46 in order to protect parts of the semiconductor chips 42 and 43 and the wire 44, and lead molding for molding and surface treating an external lead. Thereby, the assembly process of the MCP having the package structure is completed to have a structure in cross section as shown in FIG. 9.

Finally, the performance test of the MCP having completed the assembly process is performed. In this performance test, for example, similarly to the performance test of the semiconductor chips 42 and 43, the memory function is tested by using a predetermined test pattern together with the write and read operations relative to the SRAM and the flash memory, the function test is performed to confirm operation or non-operation based on the given functions, the open/short inspection between input/output terminals, the leakage current inspection, the DC test such as measurement of power supply current, the AC test for testing an AC timing of the SRAM and flash memory control, and the like.

As a result of this MCP performance test, only the good MCPs in quality are shipped as a product. Regarding this result of the MCP performance test, since the SRAM and flash memory semiconductor chips 42 and 43 subjected to burn-in are combined to assemble the MCP, the burn-in in the assembly process is not required, thereby increasing the yield of the performance test of the assembled products. On the contrary, in a method of performing burn-in after assembly as performed in conventional examples, if either of the SRAM semiconductor chip or the flash memory semiconductor chip becomes bad in quality, the MCP also becomes bad, so that the yield of the assembled products decreases.

Next, one example of the characteristic of a change in bad rate (bath-tub curve) will be described with reference to FIG. 12.

The bad rate of products such as MCPs (similarly to semiconductor chips under the state of a semiconductor wafer) is known that as time goes, early failure, chance failure and abrasive failure occur in order, as shown in FIG. 12. The early failure area has a characteristic of rapid decrease from a high value of the bad rate as time goes. The chance failure area is an area where a value decreased in the early failure area of the bad rate is kept constant when time goes within the chance failure area. The abrasive failure area has a characteristic of increase in the bad rate from the constant value maintained in the chance failure area as time goes.

The above-described burn-in is particularly a screening method for removing a semiconductor chip that becomes bad in the early failure area. Additionally, the burn-in is also such a method that the semiconductor chips are prevented from arriving at the abrasive failure area immediately after shipment by excessive burn-in. Therefore, by monitoring the bad rate in the middle of burn-in, burn-in time can be set as depending on quality of the semiconductor wafer. Hereinafter, the burn-in sequence equipped with monitor function will be described.

Next, one example of a flow in the burn-in sequence equipped with monitor function will be described with reference to FIG. 13. In this case, the test circuit 2 shown in the above-described FIG. 2 performs exclusive OR operation of a carry signal from the counter COUNT and the read data from the data output buffer 18 of the SRAM 1 via the EXOR gate EXOR1 as shown by a broken line, so that it is possible to monitor the middle of burn-in by outputting this signal from the test input/output terminal via the clocked inverter CIV5.

At first, test circuit operating condition of each semiconductor chip by start of the burn-in is first set to the concurrent mode (a step S301) and then to the current mode (a step S302). And, a contact check is performed for checking the electric connection/non-connection between each terminal of each semiconductor chip and each needle (a step S303).

As a result of this contact check, in case where each terminal of each semiconductor chip and each needle are not electrically connected (NG), contact thereof is reviewed (a step S304). On the other hand, in case where each terminal of each semiconductor chip and each needle are electrically connected (OK), the write operation is first performed (a step S305) and subsequently the read operation is performed (a step S306), and thereby goodness or badness thereof is judged per semiconductor chip by write/read tests in the initial stage.

Moreover, regarding the good semiconductor chip, high temperature and voltage stress exceeding the rating is applied to perform the burn-in during monitor (a step s307). As one example, monitoring is performed about one every hour.

Additionally, the write operation (a step S308) and the read operation (a step S309) are performed, and thereby goodness or badness thereof is judged per semiconductor chip by the write/read tests.

Then, it is judged whether the early failure area has been completed or not, from the monitored change in the bad rate (a step S310). As a result of this judgment, if the early failure area is not completed, the processing performed at the burn-in of the step S307 is repeated. On the other hand, if the early failure area is completed, the burn-in sequence is completed in accordance with completion of the early failure area. In this manner, since monitor of the bad rate in the middle of burn-in results in completion of the early failure area, bad semiconductor wafers perform the burn-in for a long time and good semiconductor wafers in quality can complete the burn-in for a short time.

Next, one example of timing in the operation of the above-described test circuit 2 will be described with reference to FIGS. 14 to 16. FIG. 14 shows set timing for operation mode. FIG. 15 shows timing for burn-in and timing for contact check. FIG. 16 shows timing for burn-in equipped with monitor function.

As shown in FIG. 14, set timing of the operation mode resets the test circuit 2, and then performs, for example, twice setting to concurrent mode such as concurrent modes 1 and 2, and thereafter performs current mode set. At this time, operation of the test circuit 2 synchronizes the test clock signal "Test Clock", and is performed by input and output of the test input/output data "Test I/O" in accordance with the test control signal "CTRL1" and "CTRL2", as shown in the truth value table in the test circuit 2 of the above-described FIG. 3 and in the test command table of FIG. 4.

In the concurrent mode set 1, test results based on the test commands "TC1" having one cycle, "TC2" having two cycles, and "TC3" having three cycles of the test clock signal "Test Clock" are output as the test input/output data "Test I/O". When the output of this concurrent mode set 1. is finished, the test clock signal "Test Clock" becomes non-operation condition NOP, performs a flag set, and then becomes the non-operation condition NOP again. Similarly to the concurrent mode set 1, the concurrent mode set 2 is performed. When the output of this concurrent mode set 2 is finished, the test clock signal "Test Clock" becomes non-operation condition NOP, performs a flag set, and then becomes the non-operation condition NOP again. Thereafter, the current mode set is performed.

As shown in FIG. 15, the timing for burn-in and contact check becomes a start of the test after becoming non-operation condition NOP when output of the current mode set is finished. As one example, in case where address Add of the SRAM is from o to 1023, the test clock signal "Test Clock" performs the burn-in and contact check by two cycles thereof, that is, inputs at a first cycle of the two cycles and outputs at a second cycle relative to each of the addresses AddO to Add1023. In the first cycle burn-in and contact check relative to each of the addresses AddO to Add1032, for example, "0" data of the carry signal of the counter COUNT is written, and if the result thereof is good, the test input/output data "Test I/O" outputs "L". Subsequently, even in the second cycle burn-in and contact check, for example "1" data of the carry signal of the counter COUNT is written, and when the result thereof is good, the test input/output data "Test I/O" outputs "H". This is repeatedly performed by the predetermined number of times relative to each of the addresses AddO to Add1023.

As shown in FIG. 16, the timing for burn-in equipped with monitor function is performed similarly to the timing for the above-described burn-in and contact check. In the burn-in for each of the addresses AddO to Add1023, if the result thereof is bad for each of the addresses AddO to Add1023, the 'test input/output data "Test I/O" outputs "H" (Fail), and if the result thereof is good, it outputs "L" (Pass). This is repeatedly performed by the predetermined number of times. In the middle of this process, burn-in is performed while the result of goodness or badness is monitored relative to each of the addresses AddO to Add1023.

Next, one example of timing in internal operation at the burn-in will be described with reference to FIG. 17.

The SRAM 1 including the above-described test circuit 2 performs the write or read operations of each of the addresses "Address" (An−1, An, An+1) in two cycles of the test clock signal "Test Clock". At this time, the SRAM 1 is controlled to be in a standby state at a first cycle and to perform the read/write operations (Read/Write) at a second cycle. The write operation is permitted by activation of a write enable signal "/WE", and the write data is written in the SRAM 1. For example, "1" data is written at the first cycle and "0" is written at the second cycle by the carry signal of the counter COUNT. At this time, an output enable signal is fixed to "H" to become the write mode.

Moreover, the read operation is permitted by fixing the write enable signal "/WE" to "H" and, at this time, becomes the read mode by activation of the output enable signal.

Next, one example of a circuit constitution of a row decoder 12a capable of multiple-choice will be described with reference to FIG. 18.

In comparison with the above-described row decoder 12 shown in FIG. 5, this row decoder 12a capable of multiple-choice has NAND gates added between a buffer of an address signal "A0" and a wiring matrix. The row decoder 12a comprises a plurality of buffers DBUF21 to DBUF23, a plurality of AND gates AND21 toAND28, and NAND gates NAND2 1 and NAND2 2. The AND gates AND2 1 to AND 28 have input terminal numbers different from those of the AND gate shown in FIG. 5.

This row decoder 12a has logic composition capable of realizing operation shown in a truth value table of multiple-choice row decoder of FIG. 19. That is, if a mode signal "Mode" is "1", normal decode operation is performed in which one memory cell can be selected from memory cells M0 to M7 by always specifying one row selection line. For example, in case where the address signals "A0" to "A2" are all "0", the memory cell M0 is selected. In case where only the address signal "A0" is "1", the memory cell M1 is selected . . . . In case where the address signals "A0" to "A2" are all "1", the memory cell M7 is selected.

On the other hand, in case where the mode signal "Mode" is "0", multiple-choice decode operation is performed in which two memory cells can be selected from memory cells M0 to M7 by always specifying two row selection lines. For example, in cases where the address signals "A0" to "A2" are all "0" and where only the address signal "A0" is "1", the memory cells M0 and M1 are selected. In cases where only the address signal "A1" is "1" and where only the address signal "A2" is "0", the memory cells M2 and M3 are selected. In cases where only the address signal "A0" is "0" and where the address signals "A0" to "A2" are all "1", the memory cells M6 and M7 are selected.

Next, one example of block constitution of a test system, in case where a semiconductor chip is selected by using an output enable signal, will be described with reference to FIG. 20.

In comparison with the above-described test system shown in FIG. 6, this test system adds the test apparatus 35a to functions for outputting output enable signals "/OE" as corresponding to the semiconductor chips 31a of the semiconductor wafer 32a. This addition results in unnecessaries of the parallel/serial conversion circuit in the burn-in board 34a, and necessaries of terminals for the output enable signal "/OE" in the semiconductor chips 31a, so that the respective output enable signals "/OE" being output from the test apparatus 35a are input in these terminals.

This test system at the test mode supplies respective semiconductor chips 31 a with the output enable signal "/OE" activated in a time series manner, together with the test clock signal and the test control signal being output from the test apparatus 35a. And, the test input/output data being output from each of the semiconductor chips 31a is taken in the test apparatus 35a in a time series manner. Therefore, in this system configuration, burn-in including the contact check for examining electric connection/non-connection between each terminal of each semiconductor chip 31a and each needle 33a can be performed without requiring the parallel/serial conversion circuit 36.

Hence, according to the present embodiment, at manufacture of the MCP5, by performing burn-in of the SRAM semiconductor chips 42 and the flash memory semiconductor chips 43 under the, state of a semiconductor wafer, the MCPs can be assembled by forming both the good SRAM semiconductor chips 42 having been subjected to burn-in, and the flash memory semiconductor chips 43, so that yield in the performance test of the assembled products can be improved. Moreover, since the redundant relief processing at burn-in can be performed relative to the bad semiconductor chips, further improvement in the yield of the assembled products can be achieved.

And, when the burn-in is performed in the state of a semiconductor wafer, the contact check can be carried out by simply making six test-only signal terminals contact the needles of the burn-in board 34, each of which is a terminal for the test clock signal "Test Clock", test control signals "CTRL1" and "CTRL2", test input/output data "Test I/O", power supply voltage Vcc, and earth voltage Vss in the test circuit 2 formed in each semiconductor chip. This results in reduction of the number of needles in the burn-in board 34 and the number of terminals on each semiconductor chip to be contacted.

Furthermore, by monitoring the bad rate so that the early failure area finishes in the middle of burn-in in accordance with the change in bad rate of the semiconductor products like MCPs as time goes, it is possible to make bad semiconductor wafers in quality perform the burn-in for a long time, and good semiconductor wafers complete the burn-in in a short time. As described above, the invention implemented by the present inventor or inventors has been specifically described in accordance with the embodiments thereof, but the present invention is not limited to the above-mentioned embodiments, and, needless to say, can be variously modified without departing from the gist thereof.

For example, in the above embodiments, the description has been made of an example of an MCP on which two semiconductor chips of an SRAM and a flash memory are formed. However, various modifications of the construction of the assembled product can be made, which are a combination of a volatile memory such as RAM, DRAM, SDRAM or the like and a nonvolatile flash memory, or two volatile memories, or two nonvolatile memories, or a combination of three or more memories, or the like. Thus, the present invention can be widely applicable to the whole of semiconductor devices on which at least two semiconductor chips are formed.

Moreover, a semiconductor chip provided in each of the semiconductor wafers is preferably constituted so as to have at least two terminals, one of which is a terminal for inputting a signal for judging electric connection/non-connection between each needle connected to the test apparatus and each terminal of the semiconductor chips during the burn-in, and the other that is a terminal for outputting a response signal responding to this input signal.

In the above embodiments, an increment counter is assumed as a counter to use carry thereof, but a decrement counter may be used instead of the increment counter to use borrow output thereof.

Moreover, an example in which a carry of the counter is used for the contact check has been described, but an optional bit of the counter may be used for the contact check, or the borrow may be used in case of utilizing the decrement counter.

Effects obtained by the representative invention among the inventions disclosed in the present application, will be briefly described below.

(1) Semiconductor devices are manufactured by performing burn-in of each semiconductor chip under a state of a semiconductor wafer, cutting the semiconductor wafer to be subjected to this burn-in and dividing the semiconductor wafer per semiconductor chip, and forming a first and second semiconductor chips which are separated per semiconductor chip. Therefore, since assembly can be performed by using good semiconductor chips subjected to the burn-in in quality, it is possible to improve the yield of the assembled products in the performance test.

(2) In the above-mentioned (1), since, at the burn-in under the state of a semiconductor wafer, bad semiconductor chips in quality can be subjected to the redundant relief processing, it is possible to further improve the yield of the assembled products.

(3) At performance of the burn-in under the state of a semiconductor wafer, electrical connection between each needle connected to the test apparatus and each test-only signal terminal of the test circuit provided in each semiconductor chip can achieve the contact check. Therefore, this results in reduction of the number of needles of the burn-In board and the number of contact terminals of the semiconductor chip.

(4) By monitoring the bad rate in the middle of burn-in on the base of the change in the bad rate of the semiconductor products as time goes, burn-in time can be set depending on quality of the semiconductor wafer. Therefore, it is possible that bad semiconductor wafers in quality are subjected to burn-in for a long time, and good semiconductor wafers complete the burn-in for a short time.

(5) By using a multiple-choice decoder, the memory cells simultaneously operated can be added therein, so that time needed to perform the burn-in becomes short.

(6) According to the above-mentioned (1) to (5), in a semiconductor device such as an MCP on which two semiconductor chips comprising a volatile SRAM semiconductor chip, a nonvolatile flash memory semiconductor chip, and the like are formed, a few number of the needles and a few number of the contact terminals at the burn-in can perform electric contact check between each needle and each terminal of each semiconductor chip at the burn-in. Therefore, use of good semiconductor chips to be subjected to the burn-in result in realization of improvement in the yield of the assembled products.

What is claimed is:

1. A method of manufacturing a semiconductor device, comprising:

producing a first semiconductor wafer including first semiconductor chips;

producing a second semiconductor wafer including second semiconductor chips;

performing burn-in of the first and the second semiconductor wafer;

cutting the first and second semiconductor wafers to produce a batch of first semiconductor chips and a batch of second semiconductor chips, respectively, and assembling one of the first semiconductor chips and one of the second semiconductor chips to produce the semiconductor device, wherein assembling includes a process of forming a stacked arrangement of one or more of the first semiconductor chips and one or more of the second semiconductor chips on a substrate to produce the semiconductor device and providing prescribed electrical connections therebetween.

2. The method of manufacturing a semiconductor device according to claim 1, wherein performance of the burn-in comprises:

performing a contact check for judging electric connection/non-connection between each needle connected to a test apparatus and each terminal provided in each of the first and second semiconductor chips of the first and second semiconductor wafers, and wherein each of the first semiconductor chips includes a volatile memory and each of the second chips involves a nonvolatile memory.

3. The method of manufacturing a semiconductor device according to claim 1, wherein performance of the burn-in comprises:

performing a contact check for judging electric connection/non-connection between each needle connected to a test apparatus and each terminal provided in each of the first and second semiconductor chips of the first and second semiconductor wafers, and wherein the substrate is a wiring substrate.

4. A method of manufacturing a semiconductor device, comprising:

producing a first semiconductor wafer including first semiconductor chips;

producing a second semiconductor wafer including second semiconductor chips;

performing burn-in of the first and the second semiconductor wafer;

cutting the first and second semiconductor wafers to produce a batch of first semiconductor chips and a batch of second semiconductor chips, respectively, and assembling one of the first semiconductor chips and one of the second semiconductor chips to produce the semiconductor device, wherein assembling includes a process of forming a stacked arrangement of one or more of the first semiconductor chips and one or more of the second semiconductor chips on a substrate to produce the semiconductor device and providing prescribed electrical connections therebetween, and wherein the substrate is a wiring substrate.

5. The method of manufacturing a semiconductor device according to claim 4, wherein performance of the burn-in comprises:

performing a contact check for judging electric connection/non-connection between each needle connected to a test apparatus and each terminal provided in each of the first and second semiconductor chips of the first and second semiconductor wafers, and wherein each of the first semiconductor chips includes a volatile memory and each of the second chips involves a nonvolatile memory.

6. A method of manufacturing a semiconductor, comprising:

producing a first semiconductor wafer including first semiconductor chips;

producing a second semiconductor wafer including second semiconductor chips;

performing burn-in of the first and the second semiconductor wafer;

cutting the first and second semiconductor wafers to produce a batch of first semiconductor chips and a batch of second semiconductor chips, respectively, and assembling one of the first semiconductor chips and one of the second semiconductor chips to produce the semiconductor device, wherein assembling includes a process of forming a stacked arrangement of one or more of the first semiconductor chips and one or more of the second semiconductor chips on a substrate to produce the semiconductor device and providing prescribed electrical connections therebetween, and wherein each of the first semiconductor chips includes a volatile memory and each of the second chips includes a nonvolatile memory.

* * * * *